United States Patent
Han et al.

(10) Patent No.: US 11,690,242 B2
(45) Date of Patent: Jun. 27, 2023

(54) LIGHT EMITTING DEVICE AND DISPLAY DEVICE INCLUDING THE SAME

(71) Applicant: SAMSUNG ELECTRONICS CO., LTD., Suwon-si (KR)

(72) Inventors: Moon Gyu Han, Suwon-si (KR); Kwanghee Kim, Seoul (KR); Heejae Lee, Seoul (KR); Eun Joo Jang, Suwon-si (KR); Dae Young Chung, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/688,201

(22) Filed: Mar. 7, 2022

(65) Prior Publication Data
US 2022/0190298 A1    Jun. 16, 2022

Related U.S. Application Data

(63) Continuation of application No. 16/857,727, filed on Apr. 24, 2020, now Pat. No. 11,271,190.

(30) Foreign Application Priority Data

Apr. 26, 2019    (KR) .................... 10-2019-0049380

(51) Int. Cl.
*H01L 51/52* (2006.01)
*C09K 11/88* (2006.01)
(Continued)

(52) U.S. Cl.
CPC ........ *H01L 51/5278* (2013.01); *C09K 11/883* (2013.01); *H01L 51/0072* (2013.01); *H01L 51/502* (2013.01)

(58) Field of Classification Search
CPC ............. H01L 51/5278; H01L 51/0072; H01L 51/502
See application file for complete search history.

(56) References Cited

U.S. PATENT DOCUMENTS

| | | |
|---|---|---|
| 8,072,135 B2 | 12/2011 | Kashiwabara et al. |
| 9,692,001 B2 | 6/2017 | Toyoda et al. |

(Continued)

FOREIGN PATENT DOCUMENTS

| | | |
|---|---|---|
| EP | 03085693 A1 | 10/2016 |
| JP | 2016051845 A | 4/2016 |

(Continued)

OTHER PUBLICATIONS

Extended European Search Report dated Nov. 3, 2020, of the corresponding European Patent Application No. 20171401.1.
(Continued)

*Primary Examiner* — Anthony Ho
(74) *Attorney, Agent, or Firm* — Cantor Colburn LLP

(57) ABSTRACT

Provided are a light emitting device includes a first electrode and a second electrode facing each other; an emissive layer disposed between the first electrode and the second electrode and a display device including the same. The emissive layer comprises: a first emission layer disposed on the first electrode and having a hole transporting property; a second emission layer and a third emission layer disposed on the first emission layer; wherein the second emission layer comprises an organic compound having a bipolar transport property and the third emission layer has a composition different from the first emission layer and the second emission layer; wherein the first emission layer, the second emission layer, and the third emission layer comprises a plurality of quantum dots, and wherein the first emission layer, the second emission layer, and the third emission layer are configured to emit light of a same color.

25 Claims, 5 Drawing Sheets

(51) Int. Cl.
*H01L 51/00* (2006.01)
*H01L 51/50* (2006.01)

(56) References Cited

U.S. PATENT DOCUMENTS

| | | | |
|---|---|---|---|
| 10,373,559 | B2 | 8/2019 | Kim et al. |
| 2017/0024459 | A1 | 8/2017 | Toshiki et al. |
| 2018/0148638 | A1 | 5/2018 | Ahn et al. |
| 2018/0151817 | A1 | 5/2018 | Cho et al. |
| 2020/0235326 | A1 | 7/2020 | Rahmati et al. |
| 2020/0313106 | A1 | 10/2020 | Kim et al. |
| 2020/0335715 | A1 | 10/2020 | Chung et al. |

FOREIGN PATENT DOCUMENTS

| | | |
|---|---|---|
| KR | 1020090047034 A | 5/2009 |
| KR | 20110126216 A | 11/2011 |
| KR | 1108213 B1 | 1/2012 |
| KR | 20180079040 A | 7/2015 |
| KR | 1840423 B1 | 3/2018 |
| KR | 20180059724 A | 6/2018 |
| KR | 20180079058 A | 7/2018 |
| WO | 2019071362 A1 | 4/2019 |

OTHER PUBLICATIONS

Fernando B. Dias, Phil Trans. R. Soc. A(2015), Kinetics of thermal-assisted delayed fluorescence in blue organic emitters with large singlet-triplet energy gap, 11 pages.

Seek Jae Lee, et al., Electron. Mater. Lett., vol. 10, No. 6 (2014), pp. 1127-1131, Effect of a Broad Recombination Zone with a Triple-Emitting Layer on the Efficiency of Blue Phosphorescent Organic Light-Emitting Diodes.

Wan Ki Bae, et al., Nano Lett.(2010), 10, Multicolored Light-Emitting Diodes Based on All-Quantum-Dot Multilayer Films Using Layer-by-Layer Assembly Method, 2368-2373.

LIGHT EMITTING DEVICE AND DISPLAY DEVICE INCLUDING THE SAME

CROSS-REFERENCE TO RELATED APPLICATION

This continuation application claims priority to U.S. patent application Ser. No. 16/857,727, filed on Apr. 24, 2020, which claims priority to Korean Patent Application No. 10-2019-0049380 filed in the Korean Intellectual Property Office on Apr. 26, 2019, and all the benefits accruing therefrom under 35 U.S.C. § 119, the entire contents of which are incorporated herein by reference.

BACKGROUND

1. Field

A light emitting device and a display device including the same are disclosed.

2. Description of the Related Art

Quantum dots are nanocrystal semiconductor materials having a diameter of less than or equal to around 20 nm, and show quantum confinement effects. Quantum dots may generate stronger intensity light in a narrower wavelength region than conventional phosphors. When the quantum dots emit light, excited electrons may be transited from a conduction band to a valence band and an emission wavelength thereof may vary with a particle size and/or composition of the quantum dots. The quantum dots may be used to obtain light in a desirable wavelength region by adjusting the size and/or the composition of the quantum dots.

Advantages to electronic devices having an emission layer including quantum dots include reduced production cost, as compared to the organic light emitting diode (OLED) using an emission layer including phosphorescence and/or a phosphor material. In addition, different colors may be emitted by changing the size of the quantum dots, whereas OLED devices require the use of different organic materials in the emission layer for emitting different colors of light.

SUMMARY

Provided is a light emitting device having an improved efficiency and an improved lifetime.

Also provided is a display device including the light emitting device.

According to an embodiment, a light emitting device includes a first electrode and a second electrode facing each other; an emissive layer disposed between the first electrode and the second electrode, wherein the emissive layer includes:

a first emission layer disposed on the first electrode and having a hole transport property; and a second emission layer and a third emission layer disposed on or over the first emission layer, wherein the second emission layer includes an organic compound having a bipolar transport property and the third emission layer has a composition different from the first emission layer and the second emission layer, wherein each of the first emission layer, the second emission layer, and the third emission layer includes a plurality of quantum dots, and wherein the first emission layer, the second emission layer, and the third emission layer are configured to emit light of a same color (e.g., by application of voltage between the first and the second electrodes).

The first emission layer, the second emission layer, and the third emission layer may be configured not to emit light of different colors.

The second emission layer may be disposed on (e.g., directly on) the first emission layer and the third emission layer may be disposed on (e.g., directly on) the second emission layer.

The third emission layer may be disposed on (e.g., directly on) the first emission layer and the second emission layer may be disposed on (e.g., directly on) the third emission layer.

The plurality of quantum dots may include an organic ligand (e.g., on surfaces thereof).

The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein R is independently a C3 to C40 substituted or unsubstituted aliphatic hydrocarbon group, a C6 to C40 substituted or unsubstituted aromatic hydrocarbon group, or a combination thereof.

A hole transport ability of the first emission layer (e.g., in the emissive layer) may be greater than that of the third emission layer. A hole transport ability of the first emission layer may be greater than that of the second emission layer. A hole transport ability of the second emission layer may be greater than that of the third emission layer.

The comparison between the hole transport abilities (or electron transport abilities) of the emission layers may be made using a current density versus voltage curve of the hole-only device (HOD) (or the electron only device (EOD)) including a given emission layer (e.g., comparing a hole or electron density at a predetermined voltage for example of from about 8 volts to 12 volts). The HOD may have a structure of an electrode (e.g. ITO)/HTL (e.g., PEDOT:PSS and/or TFB)/QD emission layer/HTL (e.g., an organic HTL such as TCTA and/or HAT-CN)/an electrode (e.g., Ag). The EOD may have a structure of an electrode (e.g., ITO)/ETL (e.g. ZnMgO)/QD emission layer/ETL (e.g. ZnMgO)/an electrode (e.g., Al). A current density versus voltage curve may be obtained by using a commercially available Source Measure Unit (e.g., Keithley 2635B source meter).

The electron transport ability of the second emission layer may be greater than that of the first emission layer or that of the third emission layer.

The electron transport ability of the third emission layer may be greater than that of the first emission layer.

An amount or (a concentration) (e.g., by weight) of an organic ligand (or organic material) of the first emission layer may be less than that of the second emission layer.

An amount or (a concentration) (e.g., determined by weight) of an organic ligand (or organic material) of the first emission layer may be less than that of the third emission layer.

A weight ratio (or a concentration) of an organic ligand (or organic material) of the first emission layer may be less than or equal to about 0.7, less than or equal to about 0.6, less than or equal to about 0.5, less than or equal to about 0.4, less than or equal to about 0.3, or less than or equal to about 0.2 with respect to that of the third emission layer.

An amount of an organic ligand (or organic material) of the first emission layer may be less than or equal to about 10 wt % based on a total weight of the first emission layer.

The first emission layer and optionally the third emission layer may further include a halogen. In the emissive layer (or the first emission layer), a halogen amount may be less than or equal to about 50 wt %, less than or equal to about 25 wt %, or less than or equal to about 20 wt % with respect to a total sum of a halogen amount and an organic ligand amount (for example, that can be represented by (correspond to) a carbon amount). In the emissive layer (or the first emission layer), a halogen amount may be greater than or equal to about 0.01 wt %, greater than or equal to about 0.05 wt %, greater than or equal to about 0.1 wt %, greater than or equal to about 0.5 wt %, greater than or equal to about 1 wt %, or greater than or equal to about 2 wt % each based on a total sum of a halogen amount and an organic ligand amount.

The halogen may include fluorine, chlorine, bromine, iodine, or a combination thereof.

The organic compound having the bipolar transport ability may include a (organic) compound having at least one functional group that is selected from a substituted or unsubstituted (linear or branched) C4 to C15 alkyl group, a cyano group, substituted or unsubstituted hetero-aromatic group containing an O-, S-, Se-, Te-, or N-moiety, and a combination thereof.

The organic compound having the bipolar transport ability may include a carbazole unit (e.g., a carbazole group).

The bipolar transport moiety may include a substituted or unsubstituted carbazolyl group, a substituted or unsubstituted arylamine group, a substituted or unsubstituted aryl phosphine group, a substituted or unsubstituted aryl phosphine oxide group, a substituted or unsubstituted phenothiazinyl group, a substituted or unsubstituted phenoxazinyl group, a substituted or unsubstituted dihydrophenazinyl group, a substituted or unsubstituted pyrazolyl group, a substituted or unsubstituted pyridyl group, a substituted or unsubstituted azulenyl group, a substituted or unsubstituted thiophenyl group, a substituted or unsubstituted pyrrolyl group, a substituted or unsubstituted furanyl group, or a combination thereof.

The organic compound having the bipolar transport ability may include a compound represented by Chemical Formula 1:

Chemical Formula 1

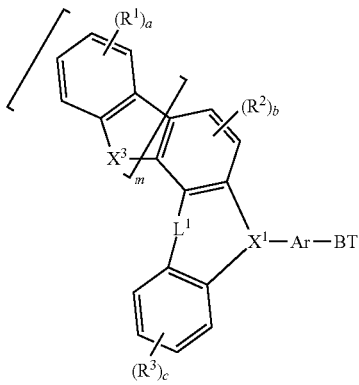

In Chemical Formula 1,

Ar is a C6 or higher aromatic (e.g., aryl) group (e.g., containing an aryl moiety);

BT is a bipolar transport functional group including a substituted or unsubstituted hetero aromatic group (e.g., heteroaryl group) containing an O-, S-, Se-, Te-, or N-moiety, or a combination thereof, $R^1$ to $R^3$ are each independently selected from hydrogen, a substituted or unsubstituted C4 to C15 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, a substituted or unsubstituted arylamine group, a substituted or unsubstituted carbazolyl group, and a combination thereof, provided that at least one of $R^1$ to $R^3$ is a substituted or unsubstituted C4 to C15 alkyl group, and a is an integer of 1 to 4, c is an integer of 1 to 4, and b is 1 or 2, $X^1$ is N or $C(R^a)$, wherein $R^a$ is independently selected from hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, and a combination thereof, $L^1$ is a single bond, a substituted or unsubstituted methylene group, or a substituted or unsubstituted C2 to C4 alkenylene group, and m is 0 or 1, and when m is 1, $X^3$ is S, N—$R^b$, or $C(-R^c)(-R^d)$, wherein $R^b$, $R^c$ and $R^d$ are each independently hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, or a combination thereof, In Chemical Formula 1, when a is an integer of 2 to 4, $R^1$ moieties are present independently from one another or any two $R^1$ adjacent to each other are optionally linked to one another to form a C5 to C15 fused ring, when c is an integer of 2 to 4, $R^3$ moieties are present independently from one another or any two $R^3$ adjacent to each other are optionally linked to one another to form a C5 to C15 fused ring, when b is 2, $R^2$ moieties are present independently from one another or any two $R^2$ adjacent to each other are optionally linked to one another to form a C5 to C15 fused ring.

In Chemical Formula 1, the BT may include a substituted or unsubstituted carbazolyl group, a substituted or unsubstituted arylamine group (e.g., a substituted or unsubstituted triarylamine group, a substituted or unsubstituted benzidinyl group, or substituted or unsubstituted tetraaryl-paraphenylene diamine group), a substituted or unsubstituted aryl phosphine group, a substituted or unsubstituted aryl phosphine oxide group, a substituted or unsubstituted phenothiazinyl group, a substituted or unsubstituted phenoxazinyl group, a substituted or unsubstituted dihydrophenazinyl group, a substituted or unsubstituted pyrazolyl group, a substituted or unsubstituted pyridyl group, a substituted or unsubstituted azulenyl group, a substituted or unsubstituted thiophenyl group, a substituted or unsubstituted pyrrolyl group, a substituted or unsubstituted furanyl group, or a combination thereof.

In Chemical Formula 1, the substituted or unsubstituted C4 to C15 alkyl group may be a linear or branched C4 to C15 alkyl group having or not having a substituent. In Chemical Formula 1, at least two of $R^1$ to $R^3$ may be a substituted or unsubstituted C4 to C15 alkyl group.

The BT of Chemical Formula 1 may be a substituted or unsubstituted cabazolyl group.

The organic compound having the bipolar transport ability may include a compound represented by Chemical Formula 1A:

Chemical Formula 1A

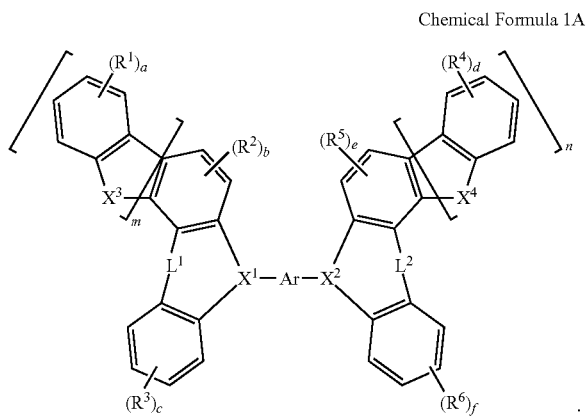

In Chemical Formula 1A, Ar is a C6 or greater, for example, a C12 or greater aromatic group (e.g., including an aryl moiety), $R^1$ to $R^6$ are each independently selected from hydrogen, a substituted or unsubstituted C4 to C15 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, a substituted or unsubstituted arylamine group, a substituted or unsubstituted carbazolyl group, and a combination thereof, provided that at least one (e.g., at least two) of $R^1$ to $R^6$ is a substituted or unsubstituted C4 to C15 alkyl group, a and d are each independently an integer of 1 to 4, c and f are each independently an integer of 1 to 4, b and e are each independently 1 or 2, $X^1$ and $X^2$ are each independently N or $C(R^a)$, wherein $R^a$ is each independently selected from hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, and a combination thereof, $L^1$ and $L^2$ are each independently selected from a single bond, a substituted or unsubstituted methylene group, a substituted or unsubstituted C2 to C4 alkenylene group, and a combination thereof, m and n are each independently 0 or 1, and when m or n are each independently 1, $X^3$ and $X^4$ are each independently selected from S, N—$R^b$, C(—$R^c$)(—$R^d$), or a combination thereof, wherein, $R^b$, $R^c$ and $R^d$ are independently hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, and a combination thereof.

When a is an integer of 2 to 4, $R^1$ moieties are present independently from one another or any two $R^1$ adjacent to each other are optionally linked to one another to form a C5 to C15 fused ring.

When b is an integer of 2, $R^2$ moieties are present independently from one another or any two $R^2$ adjacent to each other are optionally linked to one another to form a C5 to C15 fused ring.

When c is an integer of 2 to 4, $R^3$ moieties are present independently from one another or any two $R^3$ adjacent to each other are optionally linked to one another to form a C5 to C15 fused ring.

When d is an integer of 2 to 4, $R^4$ moieties are present independently from one another or any two $R^4$ adjacent to each other are optionally linked to one another to form a C5 to C15 fused ring.

When e is an integer of 2, $R^5$ moieties are present independently from one another or two $R^5$ are optionally linked to one another to form a C5 to C15 fused ring.

When f is an integer of 2 to 4, $R^6$ moieties are present independently from one another or any two $R^6$ adjacent to each other are optionally linked to one another to form a C5 to C15 fused ring.

In Chemical Formula 1 or Chemical Formula 1A, the Ar may be a group represented by any of Chemical Formulae 2A to 2E.

Chemical Formula 2A

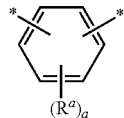

In Chemical Formula 2A, $R^a$ is each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, and a combination thereof, and a is an integer of 1 to 4.

Chemical Formula 2B

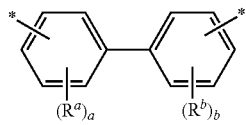

In Chemical Formula 2B, $R^a$ and $R^b$ are each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, and a combination thereof, and a and b are each independently an integer of 1 to 4.

Chemical Formula 2C

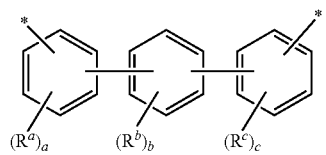

In Chemical Formula 2C, $R^a$, $R^b$ and $R^c$ are each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, and a combination thereof, and a, b and c are each independently an integer of 1 to 4.

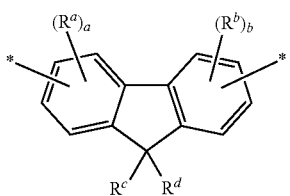

Chemical Formula 2D

In Chemical Formula 2D, $R^a$, $R^b$, $R^c$, and $R^d$ are each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, and a combination thereof, and a and b are each independently an integer of 1 to 3.

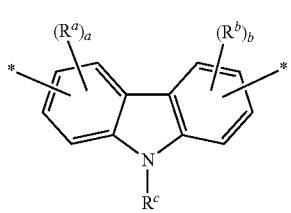

Chemical Formula 2E

In Chemical Formula 2E, $R^a$, $R^b$ and $R^c$ are each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, and a combination thereof, and a and b are each independently an integer of 1 to 3.

In Chemical Formula 2E, $R^c$ may be a bipolar transport functional group.

In a functional group represented by any of Chemical Formulae 2A to 2E, the substituted or unsubstituted C3 to C30 heteroaryl group may include an O-, S-, Se-, Te- or N-containing heteroaryl group.

In Chemical Formula 1A, the substituted or unsubstituted C4 to C15 alkyl group may be branched or linear.

The organic compound may be included in an amount of greater than or equal to about 2 wt % and less than or equal to about 50 wt %, based on a total weight of the second emission layer.

A thickness of the first emission layer may be greater than or equal to about 1 nm and less than or equal to about 100 nm.

A thickness of the second emission layer may be greater than or equal to about 1 nm and less than or equal to about 100 nm.

A thickness of the third emission layer may be greater than or equal to about 1 nm and less than or equal to about 100 nm.

A thickness of the emissive layer may be greater than or equal to about 25 nm, greater than or equal to about 30 nm, greater than or equal to about 35 nm, greater than or equal to about 40 nm, greater than or equal to about 44 nm, greater than or equal to about 45 nm, greater than or equal to about 48 nm, greater than or equal to about 50 nm, or greater than or equal to about 52 nm. A thickness of the emissive layer may be less than or equal to about 200 nm, less than or equal to about 150 nm, less than or equal to about 100 nm, less than or equal to about 90 nm, less than or equal to about 80 nm, or less than or equal to about 70 nm.

The light emitting device may further include a first charge auxiliary layer disposed between the emissive layer and the first electrode, a second charge auxiliary layer disposed between the emissive layer and the second electrode, or a combination thereof.

The second charge auxiliary layer may include a plurality of inorganic nanoparticles. An inorganic nanoparticle of the plurality of inorganic particles may include a metal oxide represented by $Zn_{1-x}M_xO$, wherein, M is Mg, Ca, Zr, W, Li, Ti, Y, Al, or a combination thereof, and $0 \leq x \leq 0.5$.

The light emitting device may have a T95 of greater than or equal to about 6.5 hours.

The light emitting device may have a maximum EQE of greater than or equal to about 14%.

In an embodiment, a method of manufacturing the aforementioned light emitting device includes forming the emissive layer on the first electrode and forming the second electrode on the emissive layer, wherein the forming of the emissive layer includes forming the first emission layer on the first electrode and forming the second emission layer and the third emission layer on the first emission layer.

The formation of the first emission layer may include forming a first film including first quantum dots having an organic ligand, preparing a treating solution including a metal halide and an organic solvent, contacting the first film with the treating solution, and removing the treating solution from the first film to form the first emission layer.

The formation of the second emission layer may include preparing a second organic solution including second quantum dots having an organic ligand and the organic compound having the bipolar transport property in an organic solvent; applying the second organic solution to the first emission layer or the third emission layer to obtain a second film; and removing the organic solvent from the obtained second film to form the second emission layer.

The formation of the third emission layer may include preparing a third organic solution including third quantum dots having an organic ligand in an organic solvent; applying the third organic solution to the first emission layer or the second emission layer to obtain a third film; and removing the organic solvent from the obtained third film to form the third emission layer. The third quantum dots may further include halogen (e.g., as a ligand).

The metal halide may include a zinc halide.

According to another embodiment, a display device including the light emitting device is provided.

The light emitting device may show improved luminous properties (e.g., luminous efficiency) and improved lifetime at the same time.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
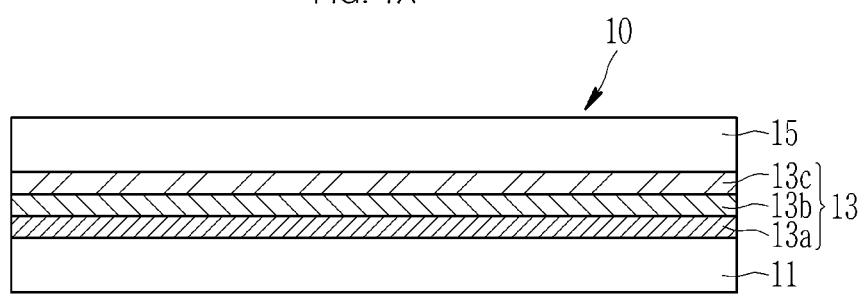
FIG. 1A is a schematic cross-sectional view of a light emitting device according to an exemplary embodiment.

Hereinafter, exemplary embodiments of the present disclosure will be described in detail so that a person skilled in the art would understand the same. This disclosure may, however, be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "disposed on" another element, it can be directly on the other element or intervening elements may also be present. In contrast, when an element is referred to as being "directly on" or "directly disposed on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "upper," can therefore, encompasses both an orientation of "lower" and "upper," depending on the particular orientation of the figure.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or energy level (e.g., a highest occupied molecular orbital (HOMO) energy level or lowest unoccupied molecular orbital (LUMO) energy level) is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

As used herein, "Group" may refer to a group of Periodic Table.

As used herein, "Group I" may refer to Group IA and Group IB, and examples thereof may include Li, Na, K, Rb, and Cs, but are not limited thereto.

As used herein, "Group II" may refer to Group IIA and Group IIB, and examples of a Group II metal may be Cd, Zn, Hg, and Mg, but are not limited thereto.

As used herein, "Group III" may refer to Group IIIA and Group IIIB, and examples of a Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples thereof may include nitrogen, phosphorus, arsenic, antimony, and bismuth, but are not limited thereto.

As used herein, "Group VI" may refer to Group VIA, and examples thereof may include sulfur, selenium, and tellurium, but are not limited thereto.

As used herein, when a definition is not otherwise provided, "substituted" refers to replacement of hydrogen of a compound, a group, or a moiety by a C1 to C30 alkyl group, a C2 to C30 alkenyl group, a C2 to C30 alkynyl group, a C2 to C30 epoxy group, a C2 to C30 alkylester group, a C3 to C30 alkenylester group (e.g., acrylate group, methacrylate group), a C6 to C30 aryl group, a C7 to C30 alkylaryl group, a C1 to C30 alkoxy group, a C1 to C30 heteroalkyl group, a C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a thiocyanate group (—SCN), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a 01 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a hydrocarbon group refers to a group including (e.g., consisting of) carbon and hydrogen (e.g., alkyl, alkenyl, alkynyl, aryl group, etc.). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having one or more carbon-carbon double bonds.

As used herein, when a definition is not otherwise provided, "alkynyl" refers to a linear or branched monovalent hydrocarbon group having one or more carbon-carbon triple bonds.

As used herein, when a definition is not otherwise provided, "aryl" refers to a group formed by removal of at least one hydrogen from an aromatic or arene group that optionally include a heteroatom (e.g., phenyl or naphthyl group). The term "aryl" may include not only an aryl moiety consisting of carbon and hydrogen but also include a heteroaryl further including a heteroatom.

As used herein, when a definition is not otherwise provided, "hetero" refers to one including 1 to 3 heteroatoms of N, O, S, Si, P, B, Se, Ge, Te, or a combination thereof.

As used herein, when a definition is not otherwise provided, "heteroaryl" refers to an aromatic group that comprises at least one heteroatom covalently bonded to one or more carbon atoms in aromatic ring.

The luminous efficiency of the emission layer including the quantum dots may be affected by a quantum efficiency of the quantum dots, a balance between charge carriers, light extraction efficiency, or the like. In order to improve the quantum efficiency, the excitons may be confined in the emission layer, but when the excitons are not confined in the emission layer by a variety of factors, it may cause a problem such as exciton quenching.

Figure 1B:
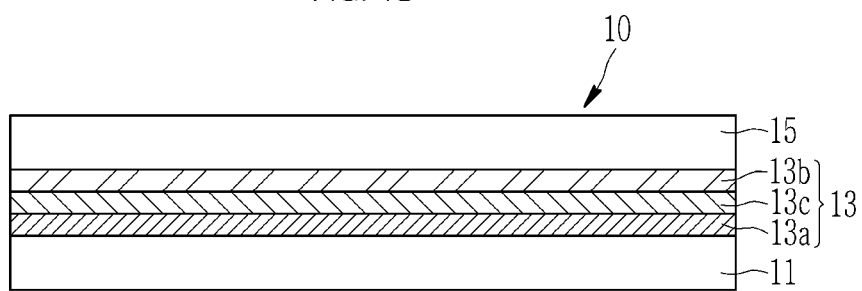
FIG. 1B is a schematic cross-sectional view of a light emitting device according to an exemplary embodiment.

FIG. 1A and FIG. 1B are a schematic cross-sectional view of a light emitting device 10 according to an exemplary embodiment.

Referring to FIG. 1A and FIG. 1B, a light emitting device 10 according to an embodiment includes a first electrode 11 and a second electrode 15 facing each other, an emissive layer 13 disposed between the first electrode 11 and the second electrode 15 and including quantum dots.

One of the first electrode 11 and the second electrode 15 may be an anode and the other may be a cathode. In an embodiment, the first electrode 11 may be an anode and the second electrode 15 may be a cathode.

The first electrode 11 may be made of a conductor, for example a metal, a conductive metal oxide, or a combination thereof. The first electrode 11 may include for example a metal such as nickel, platinum, vanadium, chromium, copper, zinc, and gold or an alloy thereof; a conductive metal oxide such as zinc oxide, indium oxide, tin oxide, indium tin oxide (ITO), indium zinc oxide (IZO), or fluorine doped tin oxide; or a combination of a metal and an oxide such as ZnO and Al or SnO$_2$ and Sb, but is not limited thereto. In an embodiment, the first electrode may include a transparent conductive metal oxide, for example, indium tin oxide. A work function of the first electrode may be higher than a work function of the second electrode that will be described below. A work function of the first electrode may be lower than a work function of the second electrode that will be described below.

The second electrode 15 may be made of a conductor, for example a metal, a conductive metal oxide, and/or a conductive polymer. The second electrode 15 may be for example made of a metal such as aluminum, magnesium, calcium, sodium, potassium, titanium, indium, yttrium, lithium, gadolinium silver, gold, platinum, tin, lead, cesium, or barium, or an alloy thereof; a conductive metal oxide such as zinc oxide, indium oxide, tin oxide, indium tin oxide (ITO), indium zinc oxide (IZO), or fluorine doped tin oxide; a multi-layered structure material such as LiF/Al, Li$_2$O/Al, Liq/Al, LiF/Ca, and BaF$_2$/Ca, but is not limited thereto.

In an embodiment, the work function of the first electrode 11 may be for example about 4.5 eV to about 5.0 eV (e.g., about 4.6 eV to about 4.9 eV) and the work function of the second electrode 15 may be for example greater than or equal to about 4.0 eV and less than about 4.5 eV (e.g., about 4.0 eV to about 4.3 eV). A work function of the first electrode may be higher than a work function of the second electrode. In another embodiment, the work function of the second electrode 15 may be for example about 4.5 eV to about 5.0 eV (e.g., about 4.6 eV to about 4.9 eV) and the work function of the first electrode 11 may be for example greater than or equal to about 4.0 eV and less than about 4.5 eV (e.g., about 4.0 eV to about 4.3 eV).

At least one of the first electrode 11 and the second electrode 15 may be a light-transmitting electrode, and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, it may include for example an opaque conductor such as aluminum (Al), silver (Ag), or gold (Au).

Thicknesses of the first electrode and the second electrode are not particularly limited and may be appropriately selected considering device efficiency. For example, the thicknesses of the first electrode and the second electrode may be greater than or equal to about 5 nm, for example, greater than or equal to about 50 nm. For example, the thicknesses of the first electrode and the second electrode may be less than or equal to about 100 μm, for example, less than or equal to about 10 μm, less than or equal to about 1 μm, less than or equal to about 900 nm, less than or equal to about 500 nm, or less than or equal to about 100 nm.

The emissive layer 13 includes a first emission layer 13a disposed on the first electrode 11. On the first emission layer 13a, a second emission layer 13b and a third emission layer 13c are (e.g., directly) disposed.

In an embodiment, the second emission layer 13b may be disposed on (e.g., directly on) the first emission layer 13a and the third emission layer 13c may be disposed on (e.g., directly on) the second emission layer 13b (see FIG. 1A). In an embodiment, the third emission layer 13c may be disposed on (e.g., directly on) the first emission layer 13a and the second emission layer 13b may be disposed on (e.g., directly on) the third emission layer 13c (see FIG. 1B).

The first emission layer 13a has a hole transporting property. As used herein, the expression "a given layer having a hole transporting property" refers to the case where a hole transport ability of the given layer is greater than a hole transport ability of adjacent emission layer(s) thereto for example, by at least 10%, at least 20%, at least 30%, at least 40%, at least 50%, at least 60%, at least 70%, at least 80%, at least 90%, at least 100%, at least 150% thereof, at least 200% thereof, at least 250% thereof, or at least 300% thereof. The hole transport ability of a given layer can be determined by measuring a hole density at a predetermined voltage (e.g., in a range of from about 8 volts to about 12 volts) for a hole only device including the same.

A hole transport ability of the first emission layer 13a may be greater than that of the third emission layer 13c. A hole transport ability of the first emission layer 13a may be greater than that of the second emission layer 13b.

The second emission layer 13b includes an organic compound having a bipolar transport ability (e.g., capable of showing both of the electron/hole transport abilities, in other words, having a bipolar nature) (hereinafter, also may be referred to as a bipolar organic compound). The bipolar organic compound may show a hole mobility and an electron mobility at a predetermined electric field (e.g., about 5.0× $10^{-6}$ V/cm) and the ratio between the hole mobility and the electron mobility may be in a range of from about 1:100 to 1:0.01, for example, from about 1:50 to about 1:0.5, from about 1:20 to about 1:0.2, from 1:15 to about 1:0.15, or from about 1:10: to about 1:0.1.

By the inclusion of the bipolar organic compound together with the quantum dots, the second emission layer 13b may exhibit a controlled hole transport ability optionally together with an enhanced electron transport ability. Accordingly, the second emission layer 13b may have a bipolar transport (e.g., hole transporting/electron transporting) property. The second emission layer 13b may have a hole transport ability that is less than that of the first emission layer and greater than that of the third emission layer. That is, the second emission layer 13b may have a hole transport ability that is between the hole transport ability of the first emission layer 13a and the hole transport ability of the third emission layer 13c. An electron transport ability of the second emission layer 13b may be greater than that of the first emission layer 13a. The electron transport ability of the second emission layer 13b may be greater than that of the third emission layer 13c. The electron transport ability of the second emission layer 13b may be less than that of the third emission layer 13c.

The electron transport ability of a given layer can be determined by measuring an electron density at a predetermined voltage (e.g., about 8 volts to about 12 volts) for an electron only device including the given layer.

The third emission layer 13c may have a composition that is (e.g., chemically) different from the first emission layer and is different from the second emission layer and thus even when substantially the same quantum dots are included therein as in the first and second emission layers, the third emission layer 13c may exhibit different hole/electron transport abilities from those of the first and second emission layers, as explained above.

Types (or amounts) of the organic compound (e.g., a bipolar transport compound or an organic ligand) included in the third emission layer may be different from those included in the first emission layer or the second emission layer, for example as will be described below. Types (or amounts) of a halogen included in the third emission layer may be different from a halogen included in the first emission layer that will be described later. In an embodiment, no halogen may be included in the second emission layer. In an embodiment, the halogen amount and/or the organic ligand amount of the third emission layer may be different from the halogen amount and/or the organic ligand amount of the first emission layer. The third emission layer may not include the bipolar organic compound. The first emission layer may not include the bipolar organic compound.

When being applied to a MIM (metal-insulator-metal) device having a structure of $1^{st}$ electrode of ITO/emissive layer/$2^{nd}$ electrode of Al, the first emission layer 13a, the second emission layer 13b, and the third emission layer 13c may exhibit different current density from one another.

In an embodiment, when being applied to the MIM device, the first emission layer 13a may exhibit a current density of greater than or equal to about 2 mA/cm$^2$ (at 3V), for example greater than or equal to about 2.5 mA/cm$^2$ (at 3V) or greater than or equal to about 3 mA/cm$^2$ (at 3V) and less than or equal to about 10 mA/cm$^2$ (at 3V), for example less than or equal to about 9.5 mA/cm$^2$ (at 3V) or less than or equal to about 9 mA/cm$^2$ (at 3V).

When being applied to the MIM device, the second emission layer 13b may exhibit a current density of greater than or equal to about 1.5 mA/cm$^2$ (at 3V), for example greater than or equal to about 2.0 mA/cm$^2$ (at 3V), or greater than or equal to about 2.5 mA/cm$^2$ (at 3V) and less than or equal to about 20 mA/cm$^2$ (at 3V), for example less than or equal to about 19.5 mA/cm$^2$ (at 3V), or less than or equal to about 19 mA/cm$^2$ (at 3V).

When being applied to the MIM device the third emission layer 13c may exhibit a current density of less than or equal to about 1.4 mA/cm$^2$ (at 3V), for example less than or equal to about 1.2 mA/cm$^2$ (at 3V) or less than or equal to about 1.0 mA/cm$^2$ (at 3V).

In an embodiment, the second emission layer 13b may be selected to have a current density that is greater than that of the third emission layer 13c by at least about 0.1 mA/cm$^2$ (at 3V), for example, by at least about 0.5 mA/cm$^2$ (at 3V), at least about 1.5 mA/cm$^2$ (at 3V), least about 2.0 mA/cm$^2$ (at 3V), at least about 4.0 mA/cm$^2$ (at 3V) or at least about 5.0 mA/cm$^2$ (at 3V).

The quantum dots may realize high color reproducibility, drawing attention as a next-generation display material as they may form an emission layer via a solution process. A colloid quantum dot may include an organic ligand (e.g., an organic compound including a long-chain aliphatic hydrocarbon and a functional group, such as oleic acid (OA)) on a surface thereof. The organic ligand may ensure dispersibility of the quantum dot in a medium, while it may interfere a charge flow in a quantum dot film. Accordingly, it may be difficult to balance the electrons/holes in the electroluminescent device including the quantum dot emission layer. When a flow of positive charges (holes) is limited in the quantum dot emissive layer 13 in comparison with the flow of negative charges (electrons), a light emitting region may be formed not inside the emissive layer but at an interface between a hole auxiliary layer (e.g., hole transport layer) and the emissive layer, and excitons produced at the interface may be easily extinct, which may have a negative influence on device efficiency. In addition, due to high LUMO energy of the QD in a QD-LED emitting blue light, surplus electrons that are not recombined with holes and remain at the interface may move toward the hole transport layer, which may result in a severe loss in the device efficiency.

However, a light emitting device according to an embodiment has the emissive layer 13 having the aforementioned structure and thus may show an increased lifespan together with improved electroluminescence properties. Without wishing to be bound by any theory, the aforementioned structure of the light emitting device according to an embodiment may have a wider luminescent region generated by the recombination of the holes and electrons. Thus, the recombination of the electrons and the holes may occur in a center portion of the emissive layer 13, leading to improved properties of the device. The present inventors hereof have found that while an increase of a thickness of a single emission layer may result in an increase of an operating voltage and deterioration of efficiency and lifetime, adopting the aforementioned structure including a plurality of the emissive layers having different hole transport properties may enhance the efficiency and the lifetime of the device, increasing device reliability.

In the emissive layer of the embodiment, the first emission layer, the second emission layer, and the third emission layer include the plurality of the quantum dots, respectively. In the emissive layer, the hole transport and the electron transport abilities may be controlled by changing the amounts and/or the types of the organic ligand (present on surfaces of the quantum dots included in each layer), the bipolar organic compound (or an I-type semiconductor material), or halogen (e.g., chlorine).

In the light emitting device according to an embodiment, the quantum dots may include an organic ligand on the surface. The organic ligand may have a hydrophobic moiety. The organic ligand may be bound to the surfaces of the quantum dots. The organic ligand may be $RCOOH$, $RNH_2$, $R_2NH$, $R_3N$, $RSH$, $R_3PO$, $R_2PH$, $RPH_2$, $R_3P$, $ROH$, $RCOOR$, $RPO(OH)_2$, $RHPOOH$, $R_2POOH$, or a combination thereof, wherein R is independently a C3 (C5) to C40 substituted or unsubstituted aliphatic hydrocarbon group such as a substituted or unsubstituted C3 to C40 alkyl or alkenyl, a C6 to C40 substituted or unsubstituted aromatic hydrocarbon group such as a substituted or unsubstituted C6 to C40 aryl group, or a combination thereof.

Examples of the organic ligand may include a thiol compound such as methanethiol, ethanethiol, propanethiol, butanethiol, pentanethiol, hexanethiol, octanethiol, dodecanethiol, hexadecanethiol, octadecanethiol, or benzylthiol; amine such as methylamine, ethylamine, propylamine, butylamine, pentyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, trimethyl phosphine, triethyl phosphine, tripropyl phosphine, tributyl phosphine, tripentyl phosphine, triphenyl phosphine, a trioctyl phosphine compound, a triphenyl phosphine compound, a diphenyl phosphine compound; a phosphine compound or an oxide compound thereof such as trimethyl phosphine oxide, triethyl phosphine oxide, tripropyl phosphine oxide, tributyl phosphine oxide, tripentyl phosphine oxide, trioctyl phosphine oxide, triphenyl phosphine oxide, or diphenylphosnine oxide; C5 to C20 alkyl phosphinic acid such as (bis-)hexyl phosphinic acid, (bis-)octyl phosphinic acid, (bis-)dodecane phosphinic acid, (bis-)tetradecane phosphinic acid, (bis-)hexadecane phosphinic acid, (bis-)octadecane phosphinic acid; C5 to C20 alkyl phosphonic acid such as hexyl phosphonic acid, octyl phosphonic acid, dodecane phosphonic acid, tetradecane phosphonic acid, hexadecane phosphonic acid, octadecane phosphonic acid and the like, but are not limited thereto. The quantum dots may include hydrophobic organic ligands alone or in a mixture of at least two types.

A change of the organic ligand included in each layer of the emissive layer 13 may have a direct effect on a hole (or electron) transport ability of the emissive layer 13. In a device of an embodiment, the types or the amounts of the organic ligand and the organic compound may be controlled in order for the electron-hole recombination to occur in a center portion of the emissive layer (e.g., the second emission layer 13b and the third emission layer 13c).

The first emission layer 13a may have a relatively small (e.g., lesser) amount of the organic ligand (e.g., oleic acid) (for example, than the second or the third emission layer). The first emission layer 13a may have a relatively large (e.g., greater) amount of the halogen (e.g., chlorine) (for example, than the second or the third emission layer).

The first emission layer 13a may have a higher hole transport ability than the adjacent layer (e.g., the second emission layer or the third emission layer). The amount of the organic ligand or the halogen (chlorine) may be confirmed by an X-ray photoelectron spectroscopy (XPS) or a scanning (transmission) electron microscopy energy dispersive X-ray spectroscopy an analysis (SEM or TEM-EDX).

When the second emission layer and/or the third emission layer is disposed on the first emission layer, the second emission layer and/or the third emission layer are closer toward the second electrode in comparison with the first emission layer and may have enhanced electron transport ability.

The second emission layer may be disposed (e.g., inserted) between the first emission layer and the third emission layer (e.g., as shown in FIG. 1A). Alternatively, the third emission layer may be disposed (e.g., inserted) between the first emission layer and the second emission layer (e.g., as shown in FIG. 1B).

In a device of an embodiment, the emissive layer may include a portion wherein a hole transporting ability changes (e.g., decrease) in a direction of a thickness. In a device of an embodiment, the first emission layer 13a having a relatively strong hole transport ability may be disposed close to the first electrode 11. In a device of an embodiment, the second emission layer 13b or the third emission layer 13c having a relatively strong electron transport ability may be disposed close to the second electrode. The third emission layer or the second emission layer may have an electron density that is higher than that of the first emission layer as measured on an electron only device (EOD) at a voltage of about 8 volts.

In a device of an embodiment, a light emitting region may be formed in a center portion of the emissive layer, and thereby the device may have improved electroluminescent properties (e.g., efficiency and brightness) and prolonged lifetime.

The first emission layer 13a and optionally the third emission layer 13c may further include halogen. The third emission layer 13c may not include halogen. In an embodiment, an amount of the halogen in the first emission layer 13a may be greater than that of the third emission layer 13c.

The first emission layer 13a may include halogen as a ligand. The second emission layer 13b may not include halogen.

In an embodiment, the amount of the organic ligand in the first emission layer 13a may be less than the amount of the organic ligand of the quantum dot of the second emission layer 13b. The amount of the organic ligand in the first emission layer 13a may be less than the amount of the organic ligand of the quantum dot of the third emission layer 13c.

In an embodiment, the amount of the organic ligand in the first emission layer 13a may be less than or equal to about 70 parts by weight, for example, less than or equal to about 65 parts by weight, less than or equal to about 60 parts by weight, less than or equal to about 55 parts by weight or less than or equal to about 50 parts by weight based on 100 parts by weight of the organic ligand of the third emission layer 13c. In an embodiment, the amount of the organic ligand in the first emission layer 13a may be greater than or equal to about 0 parts by weight, for example, greater than or equal to about 1 parts by weight, greater than or equal to about 2 parts by weight, greater than or equal to about 3 parts by weight, greater than or equal to about 4 parts by weight, greater than or equal to about 5 parts by weight, greater than or equal to about 6 parts by weight, greater than or equal to about 7 parts by weight, greater than or equal to about 8 parts by weight, greater than or equal to about 9 parts by weight, greater than or equal to about 10 parts by weight, or greater than or equal to about 12 parts by weight with respect to 100 parts by weight of the organic ligand of the third emission layer 13c.

In an embodiment, an amount of an organic material such as an organic ligand in the first emission layer 13a may be less than or equal to about 20 wt %, less than or equal to about 15 wt %, less than or equal to about 14 wt %, less than or equal to about 13 wt %, less than or equal to about 12 wt %, less than or equal to about 11 wt %, or less than or equal to about 10 wt %, based on a total weight of the quantum dots of the first emission layer 13a. The amount of the organic material in the first emission layer 13a may be greater than or equal to about 0.1 wt %, for example, greater than or equal to about 0.5 wt % or greater than or equal to about 1 wt %, based on a total weight of the quantum dots of the first emission layer 13a. The first emission layer 13a may show enhanced hole transport ability.

The amount of the organic material (e.g., the organic ligand) of the first emission layer 13a may be measured (determined) by using a scanning (or transmission) electron microscope energy dispersive x-ray spectroscopy analysis (e.g., SEM-EDX), or a thermogravimetric analysis (TGA), but is not limited thereto.

In an embodiment, the first emission layer 13a may further include a halogen (e.g., chlorine). The amount of the halogen may be less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 30 wt %, less than or equal to about 29 wt %, less than or equal to about 28 wt %, less than or equal to about 27 wt %, less than or equal to about 26 wt %, or less than or equal to about 25 wt % with respect to a total sum of the organic ligand and the halogen. With the foregoing amount of the halogen, the first emission layer 13a may show a further increased hole transport ability. The amount of the halogen may be greater than or equal to about 25 wt %, greater than or equal to about 26 wt %, greater than or equal to about 27 wt %, greater than or equal to about 28 wt %, greater than or equal to about 29 wt %, or greater than or equal to about 30 wt % with respect to a total sum of the organic ligand and the halogen.

The halogen may include fluorine, chlorine, bromine, iodine, or a combination thereof. The presence of the halogen may be confirmed by SEM-EDX, TEM-EDX, XPS, or the like, but is not limited thereto.

In an embodiment, the XPS of the emission layer (e.g., 13a) may reveal the presence of the bond with metal and halogen (e.g. $ZnCl_2$).

The molar amount of the halogen included in the emission layer (e.g., 13a) may be greater than or equal to about 0.0001, greater than or equal to about 0.0005, greater than or equal to about 0.001, greater than or equal to about 0.002, greater than or equal to about 0.003, greater than or equal to about 0.004, greater than or equal to about 0.005, greater than or equal to about 0.006, greater than or equal to about 0.007, greater than or equal to about 0.008, greater than or equal to about 0.009, greater than or equal to about 0.01, greater than or equal to about 0.05, greater than or equal to about 0.06, greater than or equal to about 0.07, greater than or equal to about 0.08, greater than or equal to about 0.09, or greater than or equal to about 0.1 with respect to 1 mole of the metal (e.g., zinc) as determined by XPS, a TEM-EDX, or a SEM-EDX. The molar amount of the halogen included in the emission layer (e.g., 13a) may be less than or equal to about 0.9, less than or equal to about 0.8, less than or equal to about 0.7, less than or equal to about 0.6, less than or equal to about 0.5, less than or equal to about 0.4, less than or equal to about 0.3, less than or equal to about 0.2, less than or equal to about 0.1, less than or equal to about 0.09, less than or equal to about 0.08, less than or equal to about 0.07, less than or equal to about 0.06, less than or equal to about 0.05, less than or equal to about 0.04, or less than or equal to about 0.03.

The first emission layer 13a, the second emission layer 13b, and the third emission layer 13c may include a plurality of quantum dots. The quantum dots are nano-sized semiconductor nanocrystal particles and may exhibit quantum confinement effects. The quantum dots may include a Group II-VI compound, a Group III-V compound, a Group IV-VI compound, a Group IV element or compound, a Group compound, a Group compound, a Group I-II-IV-VI compound, or a combination thereof.

The Group II-VI compound may be a binary element compound of CdSe, CdTe, ZnS, ZnSe, ZnTe, ZnO, HgS, HgSe, HgTe, MgSe, MgS, or a mixture thereof; a ternary element compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; and a quaternary element compound of HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof. The Group II-VI compound may further include a Group III metal. The Group III-V compound may be a binary element compound of GaN, GaP, GaAs, GaSb, AlN, AlP, AlAs, AlSb, InN, InP, InAs, InSb, or a mixture thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a mixture thereof; and a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The Group III-V compound may further include a Group II metal (e.g., InZnP). The Group IV-VI compound may be a binary element compound of SnS, SnSe, SnTe, PbS, PbSe, PbTe, or a mixture thereof; a ternary element compound of SnSeS, SnSeTe, SnSTe, PbSeS, PbSeTe, PbSTe, SnPbS, SnPbSe, SnPbTe, or a mixture thereof; and a quaternary element compound of SnPbSSe, SnPbSeTe, SnPbSTe, or a mixture thereof. Examples of the Group compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto. The Group IV element or compound may be a single element Si, Ge, or a mixture thereof; and a binary element compound SiC, SiGe, or a mixture thereof.

In an embodiment, the quantum dots may not include a toxic heavy metal (e.g., cadmium, lead, mercury, or a combination thereof). As used herein, "not including a heavy metal" refers to the case where the heavy metal is not present in a substantial amount, for example, in an amount of less than about 100 ppm, less than about 50 ppm, less than about 30 ppm, less than about 20 ppm, or an amount of the heavy metal is below the detection limit and thus not detected. The quantum dots may include, for example, semiconductor nanocrystals including a Group III-V compound including indium and phosphorus. The Group III-V compound may further include zinc. The quantum dot may include a semiconductor nanocrystal including a Group II-VI compound including a chalcogen element (e.g., sulfur, selenium, tellurium, or a combination thereof) and zinc.

In the quantum dots, the aforementioned single element, binary element compound, ternary element compound, and/or quaternary element compound respectively exists in a uniform concentration in the particle or in partially different concentrations in the same particle. The semiconductor nanocrystals may have a core/shell structure wherein a first semiconductor nanocrystal (core) is surrounded by another second semiconductor nanocrystal (shell) having the same or different composition. In an embodiment, the quantum dots may include a core including the aforementioned compounds (i.e., Group II-VI compound, Group III-V compound, Group IV-VI compound, Group IV element or compound, Group compound, Group VI compound, Group I-II-IV-VI compound, or a combination thereof) and a shell having a different composition from the core and including the aforementioned compounds.

The core may include InP, InZnP, ZnSe, ZnSeTe, or a combination thereof. The shell may include InP, InZnP, ZnSe, ZnS, ZnSeTe, ZnSeS, or a combination thereof. The shell may include a multi-layered shell having at least two layers. The shell may include Zn, Se, and optionally S (e.g., directly) on the core. The shell may include zinc and sulfur in the outermost layer.

The core and the shell may have a concentration gradient wherein the concentration of the element(s) of the shell decreases toward the core. In addition, the semiconductor nanocrystals may have a structure including one semiconductor nanocrystal core and multiple shells surrounding the core. Herein, the multi-layered shell structure has a structure of two or more shells and each layer may have a single composition or an alloy or may have a concentration gradient.

In the quantum dots, the shell material and the core material may have different energy bandgaps from each other. For example, the energy bandgap of the shell material may be greater than that of the core material. According to another embodiment, the energy bandgap of the shell material may be less than that of the core material. The quantum dot may have a multi-layered shell. In the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer.

In an embodiment, the quantum dots may include a core including a first semiconductor nanocrystal including indium, phosphorus, and optionally zinc and a shell disposed on the core and including a second semiconductor nanocrystal including zinc and a chalcogen element. In another embodiment, the quantum dots may include a core including a first semiconductor nanocrystal including zinc, selenium, and optionally tellurium and a shell disposed on the core and including a second semiconductor nanocrystal including zinc and a chalcogen element.

The quantum dots may have a particle size of greater than or equal to about 1 nm and less than or equal to about 100 nm. The quantum dots may have a particle size of about 1 nm to about 50 nm, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, less than or equal to about 10 nm, less than or equal to about 9 nm, or less than or equal to about 8 nm. Shapes of the quantum dots are not particularly limited. For example, the shapes of the quantum dots may be a sphere, a polyhedron, a pyramid, a multipod, a cube, a rectangular parallelepiped, a nanotube, a nanorod, a nanowire, a nanosheet, or a combination thereof, but is not limited thereto.

The aforementioned quantum dots may be commercially available or appropriately synthesized.

The quantum dots may have (electroluminescence or photoluminescence) quantum efficiency of greater than or equal to about 10%, for example, greater than or equal to about 30%, greater than or equal to about 50%, greater than or equal to about 60%, greater than or equal to about 70%, greater than or equal to about 90%, or even about 100%. The quantum dots may have a relatively narrow emission spectrum. A (electro- or photo-) emission spectrum of the quantum dots may have for example a full width at half maximum (FWHM) of less than or equal to about 50 nm, for example less than or equal to about 45 nm, less than or equal to about 40 nm, less than or equal to about 35 nm, or less than or equal to about 30 nm.

In the emission layers (e.g., 13a, 13b, 13c), the quantum dots may control an absorption/emission wavelength by adjusting a composition and a size thereof. A maximum peak emission wavelength of the quantum dot may be an ultraviolet (UV) to infrared wavelength or a wavelength of greater than the above wavelength range.

For example, the maximum peak emission wavelength of the quantum dot may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm.

The maximum peak emission wavelength of the quantum dot may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm.

The maximum peak emission wavelength of the quantum dots may be in the range of about 500 nm to about 650 nm. The maximum peak emission wavelength of the quantum dots may be in the range of about 500 nm to about 550 nm (green). The maximum peak emission wavelength of the quantum dots may be in the range of about 600 nm to about 650 nm (red). The maximum peak emission wavelength of the quantum dots may be in the range of about 450 nm to about 490 nm (blue).

The first emission layer 13a may further include a p-type semiconductor material. The p-type semiconductor material may have a relatively increased hole transport property. The p-type semiconductor material may be a p-type organic polymer semiconductor of poly(styrene sulfonate) or a derivative thereof, poly-N-vinylcarbazole or a derivative thereof, polyphenylene vinylene or a derivative thereof, polyparaphenylene vinylene or a derivative thereof, poly(meth)acrylate or a derivative thereof, polyarylamine or a derivative thereof, polyaniline or a derivative thereof, polypyrrole or a derivative thereof, poly(9,9-alkylfluorene) or a derivative thereof, poly(spiro-fluorene) or a derivative thereof, poly(3-alkylthiopene)(P3AT), or a combination thereof; a p-type organic monomolecular semiconductor of pyrazoline or a derivative thereof, arylamine or a derivative thereof, stilbene or a derivative thereof, a triphenyldiamine or a derivative thereof, or a combination thereof; a p-type inorganic semiconductor of NiO, $WO_x$ (x is determined according to the oxidation number of the tungsten), $MoO_3$, CuI, CuBr; or a combination thereof. In an embodiment, the aryl of the arylamine or derivative thereof may be a C6 to C30 aryl, for example a C6 to C20 aryl, the alkyl may be a C1 to C30 alkyl, for example, a C1 to C20 alkyl.

Examples of the organic polymer semiconductor included in the first emission layer 13a may include poly(3,4-ethylenedioxy thiophene)poly(styrene sulfonate) (PEDOT: PSS), poly(N,N'-diphenyl-N,N'-bis(3-methylphenyl)-(1,1'-biphenyl)-4,4'-diamine), poly(9,9-dioctylfluorene-co-N-(4-butylphenyl)-diphenylamine), poly((9,9-dioctylfluorene)-co-N,N-diphenyl-N,N-di-(p-butylphenyl)-1,4-diaminobenzene), poly(3-hexylthiophene)(P3HT), poly(3-octylthiophene)(P3OT), and the like.

Examples of the organic monomolecular semiconductor included in the first emission layer 13a may include N,N'-di(1-naphthyl)-N,N'-diphenyl-(1,1'-biphenyl)-4,4'-diamine (NPD), N,N'-diphenyl-N,N'-bis(3-methylphenyl)-(1,1'-biphenyl)-4,4'-diamine(TPD), and the like.

The first emission layer 13a may not include any of the aforementioned p-type semiconductor materials.

If present, the p-type semiconductor material may be included in an amount of greater than or equal to about 2 wt %, greater than or equal to about 3 wt %, greater than or equal to about 4 wt %, or greater than or equal to about 5 wt % and less than or equal to about 50 wt %, less than or equal to about 49 wt %, less than or equal to about 48 wt %, less than or equal to about 47 wt %, less than or equal to about 46 wt %, or less than or equal to about 45 wt %, based on a total weight 100 wt % of the first emission layer 13a.

The second emission layer 13b includes the bipolar organic compound (i.e., the organic compound having the bipolar transport ability, hereinafter, also referred to as an I-type semiconductor material) in addition to the plurality of the quantum dots.

The I-type semiconductor material may be present on (e.g., surfaces of) the quantum dots included the second emission layer 13b. The I-type semiconductor material may include an organic compound having a bipolar transport moiety of a substituted or unsubstituted C4 to C15 alkyl group, a cyano group, a substituted or unsubstituted hetero-aromatic group containing O-, S-, Se-, Te-, or N-moiety, or a combination thereof.

The I-type semiconductor material may include a carbazole unit including the bipolar transport moiety of a substituted or unsubstituted C4 to C15 alkyl group, a cyano group, a substituted or unsubstituted hetero-aromatic group containing O-, S-, Se-, Te-, or N-moiety, or a combination thereof. Without wishing to be bound by any theory, the second emission layer 13b including the I-type semiconductor material may exhibit enhanced electrical conductivity.

The I-type semiconductor material may include a compound represented by Chemical Formula 1:

Chemical Formula 1

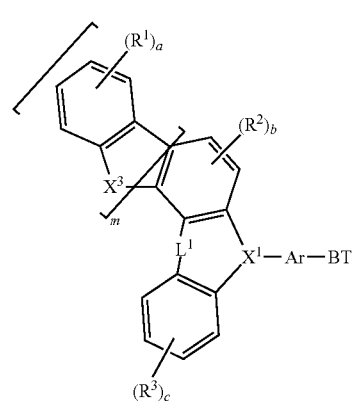

In Chemical Formula 1,

Ar is a C6 or higher (e.g., C12 or higher) aromatic group (e.g., containing an aryl moiety);

BT is a bipolar transport functional group, $R^1$ to $R^3$ are selected each independently from hydrogen, a substituted or unsubstituted C4 to C15 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, a substituted or unsubstituted arylamine group, a substituted or unsubstituted carbazolyl group, and a combination thereof provided that at least one of $R^1$ to $R^3$ is a substituted or unsubstituted C4 to C15 alkyl group, A is an integer of 1 to 4, c is an integer of 1 to 4, and b is 1 or 2, $X^1$ is N or $C(R^a)$, wherein $R^a$ is independently selected from hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, and a combination thereof, $L^1$ is a single bond, a substituted or unsubstituted methylene group, or a substituted or unsubstituted C2 to C4 alkenylene group, and m is 0 or 1, and when m is 1, $X^3$ is S, N—$R^b$, or $C(-R^c)(-R^d)$, wherein, $R^b$, $R^c$ and $R^d$ are independently hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, or a combination thereof.

In the above chemical formula, when a is an integer of 2 to 4, $R^1$ moieties are present independently from one another or any two $R^1$ adjacent to each other are optionally linked to one another to form a C5 to C15 fused ring.

In the above chemical formula, when c is an integer of 2 to 4, $R^3$ moieties are present independently from one another or any two $R^2$ adjacent to each other are optionally linked to one another to form a C5 to C15 fused ring.

In the above chemical formula, when b is 2, $R^2$ moieties are present independently from one another or any two $R^3$ adjacent to each other are optionally linked to one another to form a C5 to C15 fused ring.

The bipolar transport functional group of BT in Chemical Formula 1 may include a substituted or unsubstituted hetero aromatic group (e.g., heteroaryl group) containing a O-, S-, Se-, Te-, or N-moiety The bipolar transport functional group may include a substituted or unsubstituted carbazolyl group, a substituted or unsubstituted arylamine group (e.g., a substituted or unsubstituted triarylamine group, a substituted or unsubstituted benzidinyl group, or substituted or unsubstituted tetraaryl-paraphenylene diamine group), a substituted or unsubstituted aryl phosphine group, a substituted or unsubstituted aryl phosphine oxide group, a substituted or unsubstituted phenothiazinyl group, a substituted or unsubstituted phenoxazinyl group, a substituted or unsubstituted dihydrophenazinyl group, a substituted or unsubstituted pyrazolyl group, a substituted or unsubstituted pyridyl group, a substituted or unsubstituted azulenyl group, a substituted or unsubstituted thiophenyl group, a substituted or unsubstituted pyrrolyl group, a substituted or unsubstituted furanyl group, or a combination thereof.

In Chemical Formula 1, the substituted or unsubstituted C4 to C15 alkyl group may be linear or branched.

The compound represented by Chemical Formula 1 may include at least two substituted or unsubstituted C4 to C15 alkyl group.

The BT may include a substituted or unsubstituted cabazolyl group.

In an embodiment, the organic compound may include a compound represented by Chemical Formula 1A:

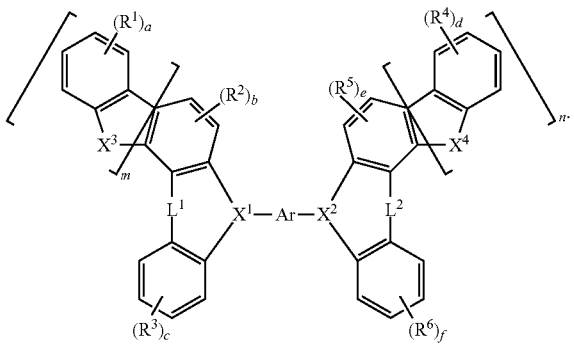

Chemical Formula 1A

In Chemical Formula 1A,

Ar is a C6 or greater, e.g., C12 or greater aromatic group (e.g., containing an aryl moiety), $R^1$ to $R^6$ are selected each independently from hydrogen, a substituted or unsubstituted C4 to C15 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, a substituted or unsubstituted arylamine group, a substituted or unsubstituted carbazolyl group, and a combination thereof, provided that at least one (e.g., at least two) of $R^1$ to $R^6$ is a substituted or unsubstituted C4 to C15 alkyl group, a, c, d, and f are each independently an integer of 1 to 4, and b and e are each independently 1 or 2, $X^1$ and $X^2$ are each independently N or $C(R^a)$, wherein $R^a$ is independently hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, or a combination thereof, $L^1$ and $L^2$ are each independently a single bond, a substituted or unsubstituted methylene group, a substituted or unsubstituted C2 to C4 alkenylene group, or a combination thereof, m and n are each independently 0 or 1, and (if present, e.g., when m and n are each independently 1) $X^3$ and $X^4$ are each independently S, N—$R^b$, $C(-R^c)(-R^d)$, or a combination thereof, wherein, $R^b$, $R^c$ and $R^d$ are independently selected from hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, and a combination thereof.

When a is an integer of 2 to 4, $R^1$ moieties are present independently from one another or any two $R^1$ adjacent to each other may be optionally linked to one another to form a C5 to C15 fused ring.

When c is an integer of 2 to 4, $R^3$ moieties are present independently from one another or any two $R^3$ adjacent to each other may be optionally linked to one another to form a C5 to C15 fused ring.

When d is an integer of 2 to 4, $R^4$ moieties are present independently from one another or any two $R^4$ adjacent to each other may be optionally linked to one another to form a C5 to C15 fused ring.

When f is an integer of 2 to 4, $R^6$ moieties are present independently from one another or any two $R^6$ adjacent to each other may be optionally linked to one another to form a C5 to C15 fused ring.

When b is 2, $R^2$ moieties are present independently from one another or any two $R^2$ may be optionally linked to one another to form a C5 to C15 fused ring.

When e is 2, $R^5$ moieties are present independently from one another or two $R^5$ may be optionally linked to one another to form a C5 to C15 fused ring.

In Chemical Formula 1 or Chemical Formula 1A, the Ar may be a group represented by any of Chemical Formulae 2A to 2E.

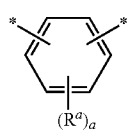

Chemical Formula 2A

In Chemical Formula 2A, $R^a$ is each independently hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, or a combination thereof, and a is an integer of 1 to 4.

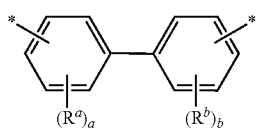

Chemical Formula 2B

In Chemical Formula 2B, $R^a$ and $R^b$ are each independently hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, or a combination thereof, and a and b are each independently an integer of 1 to 4.

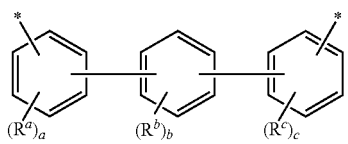

Chemical Formula 2C

In Chemical Formula 2C, $R^a$, $R^b$ and $R^c$ are each independently hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, or a combination thereof, and a, b and c are each independently an integer of 1 to 4.

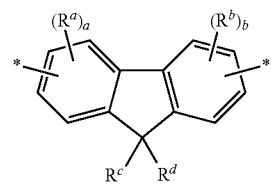

Chemical Formula 2D

In Chemical Formula 2D, $R^a$, $R^b$, $R^c$, and $R^d$ are each independently hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, or a combination thereof, and a and b are each independently an integer of 1 to 3.

In Chemical Formula 2D, the $R^c$ may be the bipolar transport functional group.

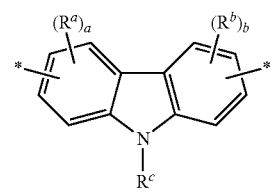

Chemical Formula 2E

In Chemical Formula 2E, $R^a$, $R^b$ and $R^c$ are each independently hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, or a combination thereof, and a and b are each independently an integer of 1 to 3.

In Chemical Formula 2E, $R^c$ may be a bipolar transport functional group.

In the group represented by any of Chemical Formulae 2A to 2E, the substituted or unsubstituted C3 to C30 heteroaryl group may include an O-, S-, Se-, Te- or N-containing heteroaryl group.

In Chemical Formula 1A, the substituted or unsubstituted C4 to C15 alkyl group may be linear or branched.

In Chemical Formula 1A, at least two of $R^1$ to $R^6$ may be a substituted or unsubstituted C4 to C15 alkyl group.

The compound represented by Chemical Formula 1 may include a compound represented by Chemical Formulae 3A to 3G:

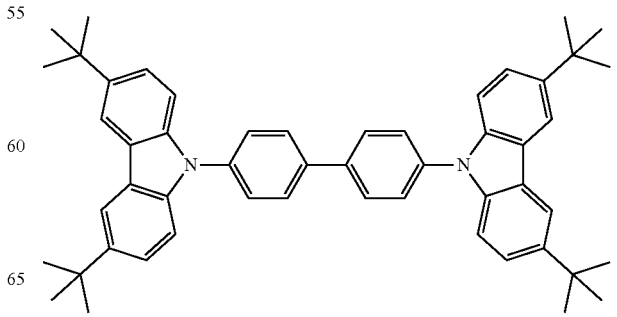

Chemical Formula 3A

Chemical Formula 3B

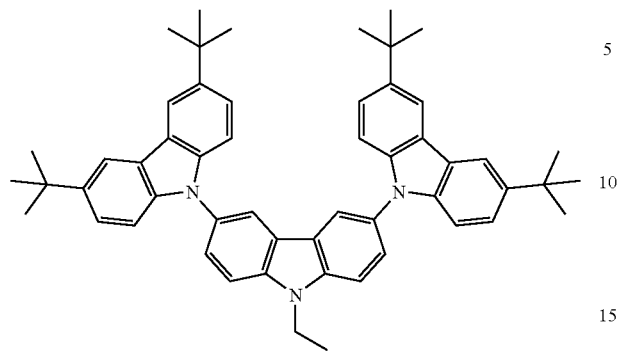

Chemical Formula 3C

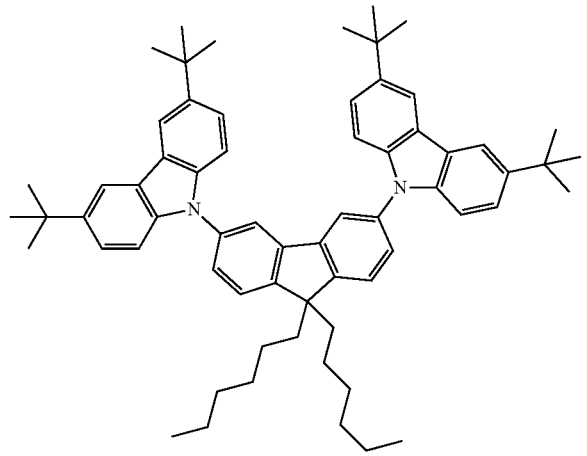

Chemical Formula 3D

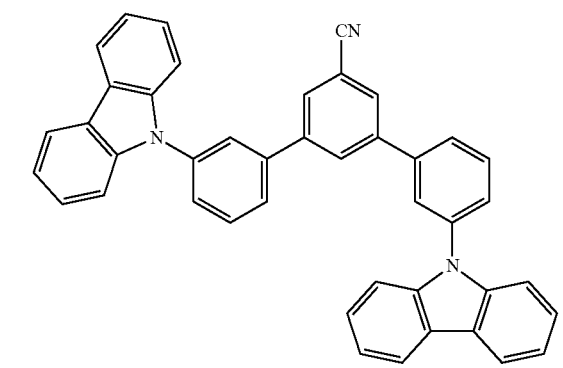

Chemical Formula 3E

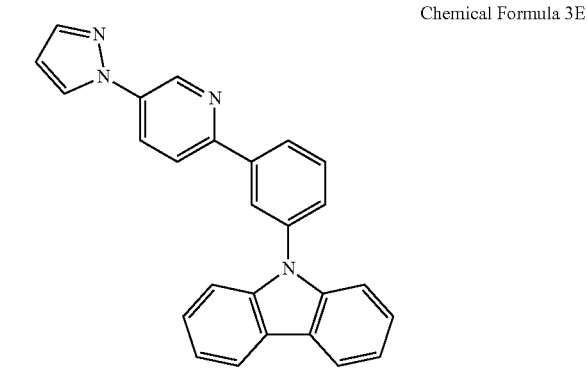

Chemical Formula 3F

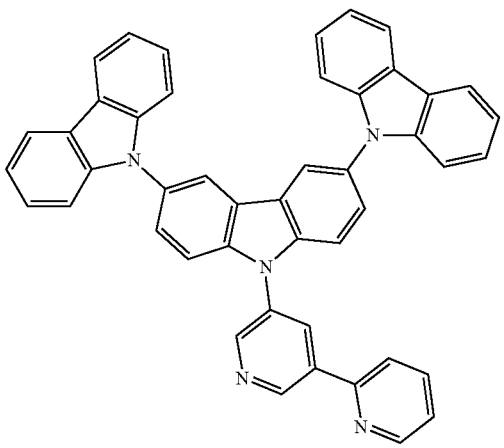

Chemical Formula 3G

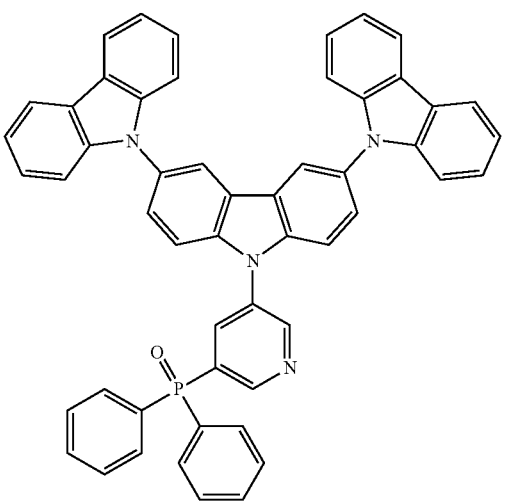

The organic compound may be included in an amount of greater than or equal to about 2 wt % and less than or equal to about 50 wt %.

The I-type semiconductor material may be included, with respect to a total weight of the second emission layer 13b, in an amount of greater than or equal to about 2 wt %, greater than or equal to about 3 wt %, greater than or equal to about 4 wt %, or greater than or equal to about 5 wt %, and less than or equal to about 50 wt %, less than or equal to about 49 wt %, less than or equal to about 48 wt %, less than or equal to about 47 wt %, less than or equal to about 46 wt %, or less than or equal to about 45 wt %. The I-type semiconductor material may enhance the hole transport ability and the electron transport ability of the second emission layer 13b.

The third emission layer 13c has a different composition form those of the second emission layer 13b and the first emission layer 13a. As used herein, having the different composition may refer to the case where a type(s) and an amount(s) of an organic material(s) (e.g., organic ligand or bipolar organic compound) or a halogen included therein are different.

The third emission layer 13c may further include halogen, if desired. If present, an amount of the halogen in the third emission layer 13c may be from about 1 wt % to 20 wt %, from about 2 wt % to 19 wt %, from about 3 wt % to 18 wt %, from about 4 wt % to 17 wt %, from about 5 wt % to 15 wt %, with respect to a total weight of the organic ligand and the halogen. In an embodiment, an amount of the halogen in the third emission layer 13c may be, with respect to a total weight of the organic ligand and the halogen, less than or equal to about 5 wt %, less than or equal to about 4 wt %, less than or equal to about 3 wt %, less than or equal to about 2 wt %, or less than or equal to about 1 wt %. In an embodiment, an amount of the halogen in the third emission layer 13c may be, with respect to a total weight of the organic ligand and the halogen, greater than or equal to about 0.001 wt %, greater than or equal to about 0.005 wt %, greater than or equal to about 0.01 wt %, greater than or equal to about 0.02 wt %, greater than or equal to about 0.03 wt %, greater than or equal to about 0.04 wt %, or greater than or equal to about 0.05 wt %.

The halogen may include fluorine, chlorine, bromine, iodine, or a combination thereof.

If desired, the third emission layer 13c may further include an N-type organic monomolecular semiconductor of a carboxylic acid compound or a derivative thereof, a quinolone or a derivative thereof, a triazine or a derivative thereof, a quinoline or a derivative thereof, a triazole or a derivative thereof, a naphthalene or a derivative thereof, an oxadiazole or a derivative thereof, an anthraquinodimethane or a derivative thereof, a benzoquinone or a derivative thereof, a naphthoquinone or a derivative thereof, an anthraquinone or a derivative thereof, a tetracyano anthraquinodimethane or a derivative thereof, a fluorenone or a derivative thereof, a diphenyldicyanoethylene or a derivative thereof, a diphenoquinone or a derivative thereof, a 8-hydroxyquinoline or a derivative thereof, or a metal complex of any of the foregoing; a N-type inorganic semiconductor $TiO_2$, $SnO_2$, $ZnO$, $ZrO_2$, $WO_3$, $Nb_2O_5$, $TiSrO_3$ or $In_2O_3$, or a combination thereof.

The third emission layer 13c may have a hole transport ability that is less than that of the second emission layer 13b. The third emission layer 13c may have an electron transport ability that is less than that of the second emission layer 13b. The third emission layer 13c may have an electron transport ability that is greater than that of the second emission layer 13b. The third emission layer 13c may have a hole transport ability that is similar to that of the second emission layer 13b.

Each of the first emission layer 13a, the second emission layer 13b, and the third emission layer 13c may be formed in a single layer or as a plurality of layers, respectively. In the formation of the plurality of layers, each layer has the same hole transport ability or has gradually varying hole transport abilities. In an embodiment, the first emission layer 13a may include two emission layers, wherein one first emission layer 1a and another first emission layer 1b is formed on the first electrode 11 and the layers 1a and 1b may the same hole transport ability or the layer 1a has a hole transport ability that is greater than that of the layer 1b.

The first emission layer 13a, the second emission layer 13b, and the third emission layer 13c may be configured to (e.g., may) emit light of the same color (e.g., red, green, or blue) (e.g., on the voltage application between the first and the second electrodes). The quantum dots in the first emission layer 13a, the second emission layer 13b, and the third emission layer 13c may emit light having the same color. Thus, a difference between the center wavelengths of luminescent peaks of these quantum dots (or the emission layers) may be less than or equal to about 15 nm, for example, less than or equal to about 10 nm, and whereby, a full width at half maximum (FWHM) of light (e.g., electroluminescence peak) emitted from the emission layer may be less than or equal to about 60 nm, less than or equal to about 50 nm, less than or equal to about 40 nm, less than or equal to about 35 nm, less than or equal to about 30 nm, less than or equal to about 25 nm, or less than or equal to about 20 nm.

The first emission layer 13a, the second emission layer 13b, the third emission layer 13c may have a thickness that is same as or different from one another.

A thickness of the emissive layer 13 may be greater than or equal to about 5 nm, greater than or equal to about 10 nm, greater than or equal to about 20 nm, greater than or equal to about 30 nm, greater than or equal to about 40 nm, greater than or equal to about 45 nm, greater than or equal to about 50 nm, or greater than or equal to about 52 nm.

A thickness of the emissive layer 13 may be less than or equal to about 200 nm, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. A thickness of the emissive layer 13 may be from about 10 nm to about 150 nm, from about 20 nm to about 100 nm, from about 30 nm to about 90 nm, from about 40 nm to about 80 nm, from about 45 nm to about 70 nm, from about 50 nm to about 65 nm, or from about 52 nm to about 60 nm.

A thickness of the first emission layer 13a, the second emission layer 13b, or the third emission layer 13c may be each independently greater than or equal to about 1 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, or greater than or equal to about 30 nm.

A thickness of the first emission layer 13a, the second emission layer 13b, or the third emission layer 13c may be less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm.

In an embodiment, a thickness of the first emission layer 13a may be greater than the second emission layer 13b or the third emission layer 13c. In an embodiment, a thickness of the first emission layer 13a may be greater than that of the second emission layer 13b or the third emission layer 13c by from about 2 nm to about 20 nm, for example, by from about 2 nm to about 15 nm. In an embodiment, the thicknesses of the first emission layer 13a, the second emission layer 13b, and the third emission layer 13c may become smaller in this order.

In an embodiment, a thickness of the first emission layer 13a, the second emission layer 13b, or the third emission layer 13c may be a thickness of at least one monolayers (or at least two monolayers) of the quantum dots, but is not limited thereto.

The emissive layer 13 may have a HOMO energy level of greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The emissive layer 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. In an embodiment, the emissive layer 13 may have a HOMO energy level of about 5.5 eV to about 6.1 eV.

The emissive layer 13 may have for example an LUMO energy level of less than or equal to about 3.8 eV, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The emissive layer 13 may have an LUMO energy level of greater than or equal to about 2.5 eV, for example, greater than or equal to about 2.6 eV, greater than or equal to about 2.7 eV, or greater than or equal to about 2.8 eV. In an embodiment, the emission layer 13 may have an energy bandgap of about 2.4 eV to about 3.5 eV.

The light emitting device may further include a substrate. The substrate may be disposed on a surface of the first electrode 11 or the second electrode 15. In an embodiment, the substrate may be disposed on a surface of the first electrode. The substrate may be a substrate including an insulation material (e.g., insulating transparent substrate). The substrate may include glass; various polymers such as polyester (e.g., polyethyleneterephthalate (PET), polyethylenenaphthalate (PEN)), polycarbonate, polyacrylate, polyimide, and polyamideimide; polysiloxane (e.g., PDMS); inorganic materials such as Al$_2$O$_3$ and ZnO; or a combination thereof, but is not limited thereto. The substrate may be made of a silicon wafer, and the like. Herein "transparent" may refer to the case where transmittance of the substrate for light in a predetermined wavelength (e.g., light emitted from the quantum dots) may be greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected considering a substrate material, and the like, but is not particularly limited. The transparent substrate may have flexibility. The substrate may be omitted.

The light emitting device 10 may further include a first charge auxiliary layer disposed between the emissive layer 13 and the first electrode 11, a second charge auxiliary layer disposed between the emissive layer 13 and the second electrode 12, or a combination thereof.

A light emitting device of an embodiment that includes the first charge auxiliary layer and the second charge auxiliary layer is explained with reference to FIG. 2.

Figure 2:
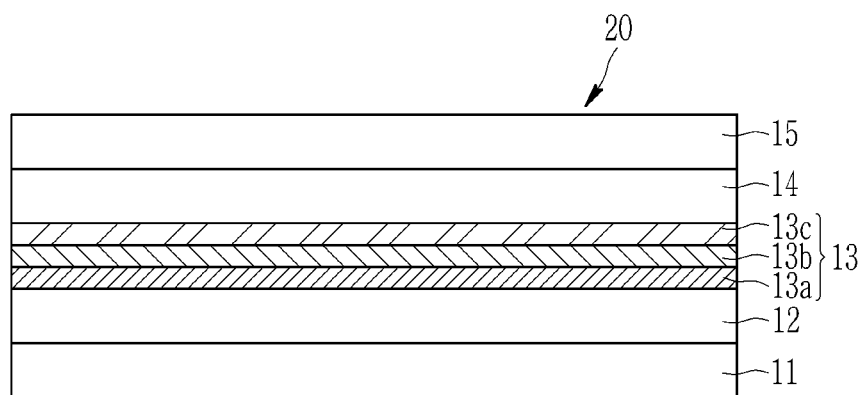
FIG. 2 is a schematic cross-sectional view of a light emitting device according to an exemplary embodiment.

FIG. 2 is a cross-section view of schematically illustrating a light emitting device of an embodiment.

Referring to FIG. 2, a light emitting device 20 includes a first electrode 11 and a second electrode 15 facing each other; an emissive layer 13 including quantum dots and disposed between the first electrode 11 and the second electrode 12; a first charge auxiliary layer 12 disposed between the emissive layer 13 and the first electrode 11 and a second charge auxiliary layer 14 disposed between the emissive layer 13 and the second electrode 15. The emissive layer 13 includes the first emission layer 13a, the second emission layer 13b, and the third emission layer 13c. As shown in FIG. 2, the second emission layer 13b may be disposed on (e.g., directly on) the first emission layer 13a and the third emission layer 13c may be disposed on (e.g., directly on) the second emission layer 13b. However, as shown in FIG. 1B, in this embodiment, the third emission layer 13c may be disposed on (e.g., directly on) the first emission layer 13a and the second emission layer 13b may be disposed on (e.g., directly on) the third emission layer 13c.

The first charge auxiliary layer 12 disposed between the emission layer 13 and the first electrode 11 may have one layer or two or more layers and may include, for example a hole injection layer, a hole transport layer, and/or an electron blocking layer.

The HOMO energy level of the first charge auxiliary layer (hole auxiliary layer) 12 may be adjusted to match the HOMO energy level of the emission layer 13, which may contribute to enhancing the hole mobility from the hole auxiliary layer 12 into the emission layer 13.

The HOMO energy level of the first charge auxiliary layer (e.g., hole transport layer) 12 adjacent to the first emission layer 13a may be the same as the HOMO energy level of the first emission layer 13a or less than the HOMO energy level of the first emission layer 13a by about 1.0 eV or less. For example, a difference between the HOMO energy levels of the first charge auxiliary layer 12 and the first emission layer 13a may be about 0 eV to about 1.0 eV, for example greater than or equal to about 0.01 eV, greater than or equal to about 0.1 eV and less than or equal to about 0.8 eV, less than or equal to about 0.7 eV, less than or equal to about 0.5 eV, less than or equal to about 0.4 eV, less than or equal to about 0.3 eV, less than or equal to about 0.2 eV, or less than or equal to about 0.1 eV.

The HOMO energy level of the second emission layer 13b (or the third emission layer 13c) adjacent to the first emission layer 13a may be the same as the HOMO energy level of the first emission layer 13a or less than the HOMO energy level of the first emission layer 13a by about 1.0 eV or less. For example, a difference between the HOMO energy levels of the first emission layer 13a and the second emission layer 13b (or the third emission layer 13c) may be about 0 eV to about 1.0 eV, for example greater than or equal to about 0.01 eV, greater than or equal to about 0.1 eV and less than or equal to about 0.8 eV, less than or equal to about 0.7 eV, less than or equal to about 0.5 eV, less than or equal to about 0.4 eV, less than or equal to about 0.3 eV, less than or equal to about 0.2 eV, or less than or equal to about 0.1 eV.

In the emission layer 13, the HOMO energy levels of the first emission layer 13a, the second emission layer 13b, and the third emission layer 13c are in similar ranges, and a difference between two adjacent layers thereof may be about 0 eV to 1.0 eV, for example greater than or equal to about 0.01 eV, for example greater than or equal to about 0.1 eV and less than or equal to about 0.8 eV, less than or equal to about 0.7 eV, less than or equal to about 0.5 eV, less than or equal to about 0.4 eV, less than or equal to about 0.3 eV, less than or equal to about 0.2 eV, or less than or equal to about 0.1 eV.

The HOMO energy level of the first charge auxiliary layer 12 may be greater than or equal to about 5.0 eV, for example, greater than or equal to about 5.2 eV, greater than or equal to about 5.4 eV, greater than or equal to about 5.6 eV, or greater than or equal to about 5.8 eV.

For example, the HOMO energy level of the first charge auxiliary layer 12 may be about 5.0 eV to about 7.0 eV, about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

In an embodiment, the first charge auxiliary layer 12 may include a hole injection layer nearer to the first electrode 11 and a hole transport layer nearer to the first emission layer 13a. Herein, the HOMO energy level of the hole injection layer may be about 5.0 eV to about 6.0 eV, about 5.0 eV to about 5.5 eV, about 5.0 eV to about 5.4 eV and the HOMO energy level of the hole transport layer may be about 5.2 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV or about 5.4 eV to about 6.1 eV.

A material included in the first charge auxiliary layer 12 (e.g., hole transport layer or hole injection layer) is not particularly limited and may include for example at least one selected from poly(9,9-dioctyl-fluorene-co-N-(4-butylphenyl)-diphenylamine) (TFB), polyarylamine, poly(N-vinylcarbazole), poly (3,4-ethylenedioxythiophene) (PEDOT), poly(3,4-ethylenedioxythiophene)polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolyl amino)phenyl]cyclohexane (TAPC), dipyrazino[2,3-f:2',3'-h]quinoxaline-2,3,6,7,10,11-hexacarbonitrile (HAT-CN), a p-type metal oxide (e.g., $NiO$, $WO_3$, $MoO_3$, etc.), a carbon-based material such as graphene oxide, and a combination thereof, but is not limited thereto.

In the first charge auxiliary layer (hole auxiliary layer) 12, a thickness of each layer may be selected appropriately. In an embodiment, the thickness of each layer may be greater than or equal to about 10 nm, for example, greater than or equal to about 15 nm, or greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The second charge auxiliary layer (electron auxiliary layer) 14 may be disposed between the emissive layer 13 and the second electrode (e.g., cathode) 15. The second charge auxiliary layer 14 may include, for example an electron injection layer, an electron transport layer, and/or a hole blocking layer, but is not limited thereto. In an embodiment, the second charge auxiliary layer 14 may include an electron transport layer.

The electron transport layer and/or the electron injection layer may include for example at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl) phenyl)quinolone), 8-hydroxyquinolinato lithium (Liq), n-type metal oxide (e.g., ZnO, $HfO_2$, etc.), or a combination thereof, but is not limited thereto. The hole blocking layer may include for example at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

In an embodiment, the second charge auxiliary layer 14 (e.g., electron transport layer) may include a plurality of nanoparticles. The nanoparticles may include a metal oxide including zinc.

The metal oxide may include $Zn_{1-x}M_xO$ (wherein M is Mg, Ca, Zr, W, Li, Ti, or a combination thereof and $0 \leq x \leq 0.5$). In an embodiment, in the above formula, M may include magnesium (Mg). In an embodiment, in the above formula, x may be greater than or equal to about 0.01 and less than or equal to about 0.3, for example, less than or equal to about 0.25, less than or equal to about 0.2, or less than or equal to about 0.15.

The metal oxide may include zinc oxide, zinc magnesium oxide, or a combination thereof. An absolute value of LUMO of the third emission layer 13c may be less than an absolute value of LUMO of the second charge auxiliary layer 14 (e.g., in case of a blue emission layer). In another embodiment, an absolute value of LUMO of the third emission layer 13c may be larger than an absolute value of LUMO of the second charge auxiliary layer 14 (e.g., in case of red or green emission layer).

An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape. The nanoparticles may not have a nano wire shape.

In an embodiment, each thickness of the second charge auxiliary layer 14 (e.g., an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

A structure of a light emitting device including a substrate is explained below, with reference to FIG. 3 and FIG. 4.

Figure 3:
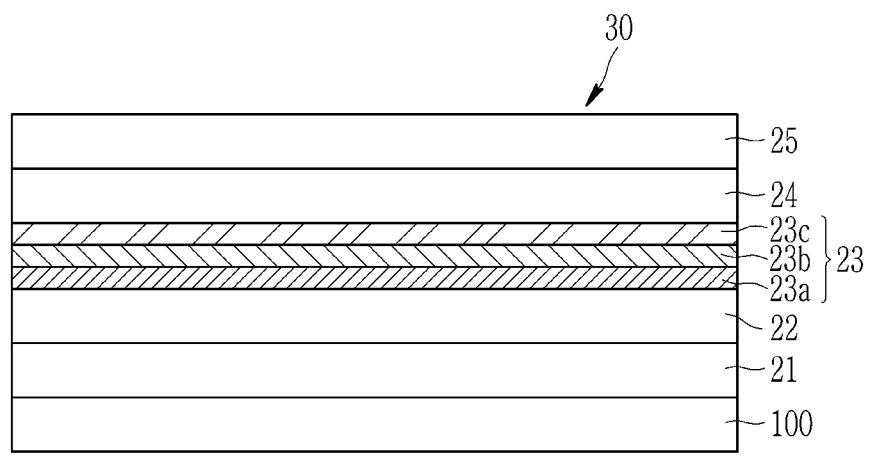
FIG. 3 is a schematic cross-sectional view of a light emitting device according to an exemplary embodiment.

FIG. 3 is a cross-sectional view schematically showing a light emitting device according to an exemplary embodiment having a normal structure. Referring to FIG. 3, a light emitting device 20 includes a first electrode (anode, 21) disposed on a transparent substrate 100 which may include a metal oxide-based transparent electrode (e.g., ITO electrode) and a second electrode 25 facing the first electrode 21 which may include a conductive metal (e.g., Mg, Al, and/or Ag, etc.) (e.g., having a relatively low work function). A first charge auxiliary layer (e.g., a hole injection layer of PEDOT: PSS and/or p-type metal oxide, and the like and/or hole transport layer of TFB and/or PVK) may be disposed between the first electrode 21 and the emissive layer 23. The hole injection layer may be near to the first electrode 21 and the hole transport layer may be near to the emissive layer 23. A second charge auxiliary layer (an electron auxiliary layer, 24) such as an electron injection layer/electron transport layer, and the like may be disposed between the emissive layer 23 and the second electrode 25. Like the emissive layer 13 of FIG. 1A or 1B, the emissive layer 23 may include a first emission layer 23a, a second emission layer 23b, and a third emission layer 23c, which correspond to the first emission layer 13a, the second emission layer 13b, and the third emission layer 13c respectively. As shown in FIG. 3, the second emission layer 23b may be disposed on (e.g., directly on) the first emission layer 23a and the third emission layer 23c may be disposed on (e.g., directly on) the second emission layer 13b. However, as shown in FIG. 1B, in this embodiment, the third emission layer 23c may be disposed on (e.g., directly on) the first emission layer 23a and the second emission layer 13b may be disposed on (e.g., directly on) the third emission layer 23c.

Figure 4:
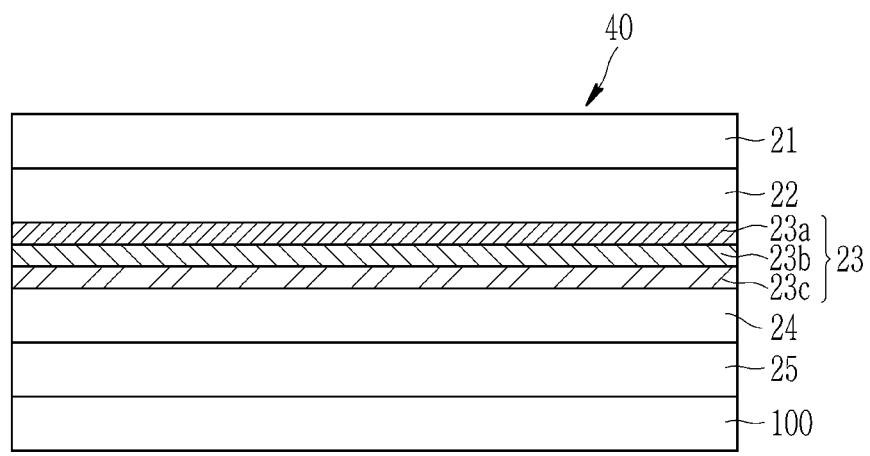
FIG. 4 is a schematic cross-sectional view of a light emitting device according to an exemplary embodiment.

FIG. 4 is a schematic cross-sectional view of a light emitting device according to an embodiment having an inverted structure. Referring to FIG. 4, a light emitting device 30 includes a second electrode 25 disposed on a transparent substrate 100 which may include a metal oxide-based transparent electrode (e.g., ITO) and a first electrode 21 facing the second electrode 25 which may include a metal (e.g., Au, Ag, Al, and/or Mg, etc.) (e.g., having a relatively high work function). For example, (optionally doped) n-type metal oxide (crystalline Zn metal oxide) may be disposed between the second electrode (transparent electrode, 25) and the emissive layer 23 as a second charge auxiliary layer 14 (an electron auxiliary layer, for example, an electron transport layer). $MoO_3$ or other p-type metal oxides may be disposed between the first electrode (metal electrode) 11 and the emissive layer 23 as a first charge auxiliary layer 22 (a hole auxiliary layer, for example, a hole transport layer including TFB and/or PVK, and/or a hole injection layer including PVK and/or $MoO_3$ or other p-type metal oxides). Like the emissive layer 13 of FIG. 1A or 1B, the emissive layer 23 may include a first emission layer 23a, a second emission layer 23b, and a third emission layer 23c, which correspond to the first emission layer 13a, the second emission layer 13b, and the third emission layer 13c, respectively. As shown in FIG. 4, the second emission layer 23b may be disposed on (e.g., directly on) the first emission layer 23a and the third emission layer 23c may be disposed on (e.g., directly on) the second emission layer 13b. However, as shown in FIG. 1B, in this embodiment, the third emission layer 23c may be disposed on (e.g., directly on) the first emission layer 23a and the second emission layer 13b may be disposed on (e.g., directly on) the third emission layer 23c.

The light emitting device may have improved electroluminescent properties. In an embodiment, a T95 of the light emitting device may be greater than or equal to about 6.5 hours. The T95 is a time that it takes for a given device to show a 95% of the initial luminance (100%) when the device is operated at 325 nit.

The light emitting device may show a maximum EQE of greater than or equal to about 14%, greater than or equal to about 14.5%, greater than or equal to about 15%, greater than or equal to about 15.5%, greater than or equal to about 16%, greater than or equal to about 16.5%, greater than or equal to about 17%, greater than or equal to about 17.5%, greater than or equal to about 18%, greater than or equal to about 18.5%, greater than or equal to about 19%, or greater than or equal to about 20%. The light emitting device may show a maximum luminance of greater than or equal to about 22,000 $cd/m^2$, for example, greater than or equal to about 23,000 $cd/m^2$, or greater than or equal to about 23400 $cd/m^2$.

In an embodiment is provided a method of producing the aforementioned light emitting device. The method includes: forming the emissive layer on the first electrode and forming the second electrode on the emissive layer, wherein the forming of the emissive layer includes forming the first emission layer on the first electrode and forming the second emission layer and the third emission layer on the first emission layer.

The method may further include forming a first charge auxiliary layer on the first electrode prior to the formation of the emissive layer. The method may further include forming a second charge auxiliary layer on the emissive layer prior to forming the second electrode.

The formation of the first emission layer may include forming a quantum dot film from a first quantum dot organic solution including first quantum dots having an organic ligand (e.g., on a surface thereof), contacting the quantum dot film with a treating solution including a metal halide and an organic solvent and then removing the treating solution from the quantum dot film (hereinafter, it may be referred to as a spin-dry treatment).

Due to the spin-dry treatment, at least a portion of the organic ligand present on a surface of the quantum dots included in the quantum dot film may be removed and/or replaced with halogen, and thereby the layer may show a enhanced hole transport ability.

Details for the first electrode, the emissive layer, and the second electrode are the same as set forth above.

The forming of the quantum dot film for the first emission layer may be performed by dispersing the quantum dots in a solvent (e.g., an organic solvent) to obtain a first quantum dot organic solution and applying or depositing the same on the first electrode in an appropriate manner (e.g., spin coating, inkjet printing, etc.).

The forming of the quantum dot film may further include heat-treating the applied or deposited film. The heat-treating temperature is not particularly limited, and may be selected appropriately considering a boiling point of the organic solvent. For example, the heat-treating temperature may be greater than or equal to about 60° C. The organic solvent of the quantum dot organic solution is not particularly limited and may be selected appropriately.

In an embodiment, the organic solvent may include a (substituted or unsubstituted) aliphatic hydrocarbon organic solvent (e.g., octane), a (substituted or unsubstituted) aromatic hydrocarbon organic solvent (e.g., toluene), an acetate solvent, or a combination thereof.

The treating solution may be an alcohol solution including a metal halide and an alcohol.

The metal halide may include Group 2B metal (e.g., zinc). The metal halide may include a fluoride, a chloride, a bromide, an iodide, or a combination thereof. In an embodiment, the metal halide may include a zinc chloride.

The preparing of the treating solution may include dissolving the aforementioned metal halide in an alcohol solvent (e.g., C1 to C10 alcohol, for example, methanol, ethanol, propanol, isopropanol, butanol, pentanol, hexanol, heptanol, etc.). A metal halide concentration in the alcohol solution may be greater than or equal to about 0.001 g/L, for example, be greater than or equal to about 0.01 g/L, be greater than or equal to about 0.1 g/L, be greater than or equal to about 1 g/L, be greater than or equal to about 10 g/L, be greater than or equal to about 50 g/L, be greater than or equal to about 60 g/L, be greater than or equal to about 70 g/L, be greater than or equal to about 80 g/L, or be greater than or equal to about 90 g/L and less than or equal to about 1000 g/L, for example, less than or equal to about 500 g/L, less than or equal to about 400 g/L, less than or equal to about 300 g/L, less than or equal to about 200 g/L, less than or equal to about 100 g/L, less than or equal to about 90 g/L, less than or equal to about 80 g/L, less than or equal to about 70 g/L, less than or equal to about 60 g/L, less than or equal to about 50 g/L, less than or equal to about 40 g/L, less than or equal to about 30 g/L, less than or equal to about 20 g/L, or less than or equal to about 10 g/L, but is not limited thereto.

The contacting of the treating solution with the first quantum dot coating film and the second quantum dot coating film may include adding the alcohol solution to the first quantum dot coating film and the second quantum dot coating film in a dropwise fashion and/or spin coating it after adding it in a dropwise fashion. The adding in a dropwise fashion or spin coating after the adding in a dropwise fashion may be performed at least once, for example, at least twice, at least three times, or at least four times.

The removing of the treating solution from the quantum dot film may include washing the quantum dot film with an alcohol solvent (e.g., adding the alcohol solvent in a dropwise fashion and optionally spin coating). The washing may be performed at least once, for example, at least twice, or at least three times.

After the removal of the treating solution (e.g., including alcohol), drying the quantum dot film may be made for example, by heating the same at a predetermined temperature.

The heating temperature may be greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The heating temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., or less than or equal to about 90° C.

The first emission layer formed by the foregoing treatment may exhibit a changed solubility with regard to an organic solvent, and accordingly, and thus the second emission layer or the third emission layer may be formed on the first emission layer via a solution process.

On the first emission layer (or the third emission layer formed in the manner that will be described below), a second quantum dot organic solution including the plurality of quantum dots having the organic ligand on surfaces thereof and the I-type semiconductor material in an organic solvent may be applied (or deposited) in an appropriate manner (e.g., a spin coating, an ink-jet printing, or the like) to form a quantum dot film, and then drying the film to provide the second emission layer.

On the first emission layer (or the second emission layer formed as above), a third quantum dot organic solution including the plurality of quantum dots having the organic ligand and optionally the halogen on surfaces thereof in an organic solvent may be applied (or deposited) in an appropriate manner (e.g., a spin coating, an ink-jet printing, or the like) to form a quantum dot film, and then drying the film to provide the third emission layer.

In the second quantum dot organic solution, details for the quantum dots, the I-type semiconductor material, and the organic solvent are the same as set forth above. Concentrations of the quantum dots and the I-type semiconductor material are selected appropriately and are not particularly limited.

In the third quantum dot organic solution, details for the quantum dots and the organic solvent are the same as set forth above. A concentration of the quantum dots (e.g., including an organic ligand and optionally halogen for example on a surface thereof) are selected appropriately and are not particularly limited. In the third quantum dot organic solution, the quantum dots including the organic ligand and the halogen may be prepared by dispersing the quantum dots having an organic ligand in an organic solvent to obtain a quantum dot dispersion, and adding a halide (e.g., $ZnCl_2$) or an alcohol solution including the same for example in a predetermined amount to the quantum dot dispersion and stirring a resulting mixture at a predetermined temperature (e.g., about 60° C.) for a predetermined time (about 30 minutes). By this treatment, a portion of the organic ligand may be exchanged with the halogen or halide (e.g., chlorine or chloride). Then, the quantum dots having the halogen together with the organic ligand may be recovered by obtaining a precipitate via the addition of a non-solvent. The obtained quantum dot may be dispersed in an organic solvent (e.g., octane) to form a quantum dot organic solution.

Details of the metal halide and the alcohol solution are the same as set forth above.

The quantum dot film formed for the second and third emission layer may be subjected to a heat-treating. Details for the heat-treating are the same as set forth for the first emission layer.

On the third or second emission layer as formed, the second electrode (e.g., cathode) 15 and optionally the second charge auxiliary layer (e.g., electron auxiliary layer) 14 may be formed. The second charge auxiliary layer (e.g., an electron auxiliary layer) 14 may be formed in an appropriate method by considering a material, a thickness, and the like of the charge auxiliary layer.

Another embodiment provides an electronic device including the aforementioned light emitting device. The light emitting device may be applied to various electronic devices such as display devices or lighting devices.

Hereinafter, the embodiments are illustrated in more detail with reference to examples. However, these examples are exemplary, and the present scope is not limited thereto.

Synthesis Example 1-1: Production of Blue Light Emitting Quantum Dot (1) Selenium (Se) and tellurium (Te) are dispersed in trioctylphosphine (TOP) to obtain a 2 molar (M) Se/TOP stock solution and a 0.1 M Te/TOP stock solution. 0.125 mmol of zinc acetate is added along with oleic acid to a reactor including trioctylamine and vacuum-treated at 120° C. After 1 hour, an atmosphere in the reactor is purged with nitrogen.

Subsequently, the reactor is heated up to 300° C., the prepared Se/TOP stock solution and Te/TOP stock solution are rapidly injected thereinto in a Te/Se ratio of 1/25. When the reaction is complete, acetone is added to the reaction solution that is rapidly cooled into room temperature, and a precipitate obtained by centrifugation is dispersed in toluene to obtain a ZnTeSe quantum dot.

(2) Sulfur (S) is dispersed in trioctylphosphine (TOP) to obtain a 1M S/TOP stock solution. 1.8 mmoL (0.336 g) of zinc acetate is added along with oleic acid to a flask including trioctylamine and vacuum-treated at 120° C. for 10 minutes. The flask is flushed with nitrogen ($N_2$), and a temperature is increased up to 180° C. The ZnTeSe core obtained in Synthesis Example 1 is put in the flask, and Se/TOP and S/TOP are injected thereinto. The reaction temperature is set to be about 280° C. After the reaction is complete, the reactor is cooled down, and the prepared nanocrystal is centrifuged with ethanol and dispersed in toluene to obtain a ZnTeSe/ZnSeS core/shell quantum dot.

Synthesis Example 2: Synthesis of Zn Metal Oxide Nanoparticles

Zinc acetate dihydrate and magnesium acetate tetrahydrate are added to dimethyl sulfoxide in a reactor so that a mole ratio of the following chemical formula is provided, and the reactor is heated at 60° C. in the air. Subsequently, an ethanol solution of tetramethyl ammonium hydroxide pentahydrate is added in a dropwise fashion thereto at a rate of 3 mL/min. The obtained mixture is stirred for one hour, and nanoparticles produced therein are centrifuged and dispersed in ethanol to obtain $Zn_xMg_{1-x}O$ nanoparticles (x=0.85).

The obtained nanoparticles are analyzed using X-ray diffraction analysis to confirm that ZnO crystals are formed. A transmission electron microscopic analysis is performed for the obtained nanoparticles, and the results show that the particles have an average size of about 3 nm.

Energy bandgaps of the obtained nanoparticles are measured and monitored by a UV band edge tangent line (UV-2600, SHIMADZU). The results show that the synthesized $Zn_xMg_{1-x}O$ nanoparticle has an energy bandgap of about 3.52 eV to 3.70 eV.

Experimental Example 1: Preparation of the Second Emission Layer and Evaluation of Electrical Properties Thereof A coating solution is prepared by mixing a quantum dot dispersion including the core/shell quantum dots prepared in Synthesis Example 1-1 with the I-type semiconductor material having a Chemical Formula 3C:

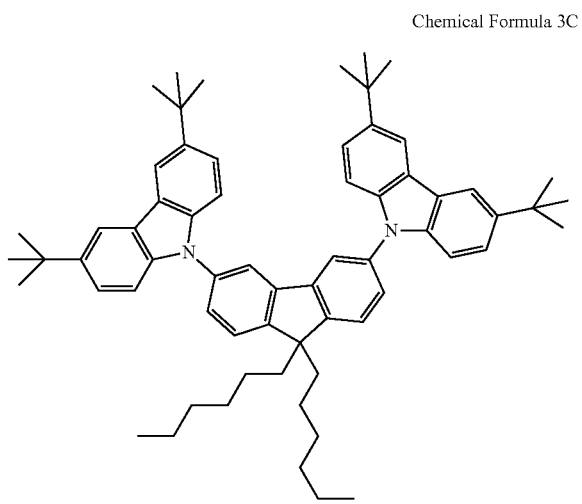 [SMILES: CCCCCCC1(CCCCCC)c2ccc(-n3c4ccc(C(C)(C)C)cc4c4cc(C(C)(C)C)ccc43)cc2-c2cc(-n3c4ccc(C(C)(C)C)cc4c4cc(C(C)(C)C)ccc43)ccc21]

Chemical Formula 3C

The prepared coating solution is spin-coated onto a glass substrate and dried on a hot plate at a temperature of about 80° C. for 20 minutes to prepare a second emission layer.

The amounts of the I-type semiconductor material in each of the coating solutions are 0 wt % (ref.), 5 wt %, 10 wt %, and 15 wt %, respectively. For the second emission layer formed on the glass substrate, a resistivity and electrical conductivity are measured by using a transmission line method (TLM).

The results are shown in Table 1.

TABLE 1

| | 0 wt %(ref) | 5 wt % | 10 wt % | 15 wt % |
|---|---|---|---|---|
| resistivity (Ω*cm) | $3.3 \times 10^7$ | $4.9 \times 10^6$ | $1.2 \times 10^6$ | $7.6 \times 10^6$ |
| electrical conductivity (S/cm) | $2.9 \times 10^{-8}$ | $2.0 \times 10^{-7}$ | $8.3 \times 10^{-7}$ | $1.3 \times 10^{-7}$ |

The results of Table 1 confirm that mixing a predetermined amount of the I-type semiconductor material of Chemical Formula 3C with the quantum dots may result in a decrease in resistivity and an increase in electrical conductivity. Such results indicate that the inclusion of the second emission layer into the emissive layer may result in an increase of an electrical property, and this may lead to an improvement of a luminous efficiency and a lifetime of a device including the same.

Experimental Example 2: Evaluation of Electrical Properties of the Emission Layer in a Metal-Insulator-Metal Device

[1] Preparation of MIM Device

Each of the following quantum dot solutions is spin-coated onto an ITO electrode (having a thickness of 150 nm) and dried on a hot-plate at a temperature of 80° C. for 20 minutes to form each of emission layers A-1, B-1, A-2, B-2, respectively to provide a MIM (metal-insulator-metal) device having a structure of first electrode (ITO)(150 nm)/QD emission layer (50 nm)/the second electrode (Al) (100 nm).

For emission layer A-1: a core/shell quantum dot dispersion prepared according to Synthesis Example 1-1

For emission layer B-1: a quantum dot dispersion including quantum dots having an organic ligand and the Cl ligand dispersed in octane. The quantum dots having an organic ligand and the Cl ligand are prepared by adding $ZnCl_2$ to the core/shell quantum dot dispersion of Synthesis Example 1-1, stirring a resulting mixture at a temperature of 60° C. for 30 minutes For emission layer A-2: a quantum dot dispersion prepared by mixing the core/shell quantum dot dispersion of Synthesis Example 1-1 (90 wt %) with the I-type semiconductor material of Chemical Formula 3C (10 wt %)

For emission layer B-2: a quantum dot dispersion prepared by mixing an octane solution of the quantum dots having an organic ligand and the Cl ligand dispersed (90 wt %) with the I-type semiconductor material of Chemical Formula 3C (10 wt %). The quantum dots having an organic ligand and the Cl ligand are prepared by adding $ZnCl_2$ to the core/shell quantum dot dispersion of Synthesis Example 1-1, stirring a resulting mixture at a temperature of 60° C. for 30 minutes

[2] Evaluation of Electrical Properties of the MIM Device

Figure 5:
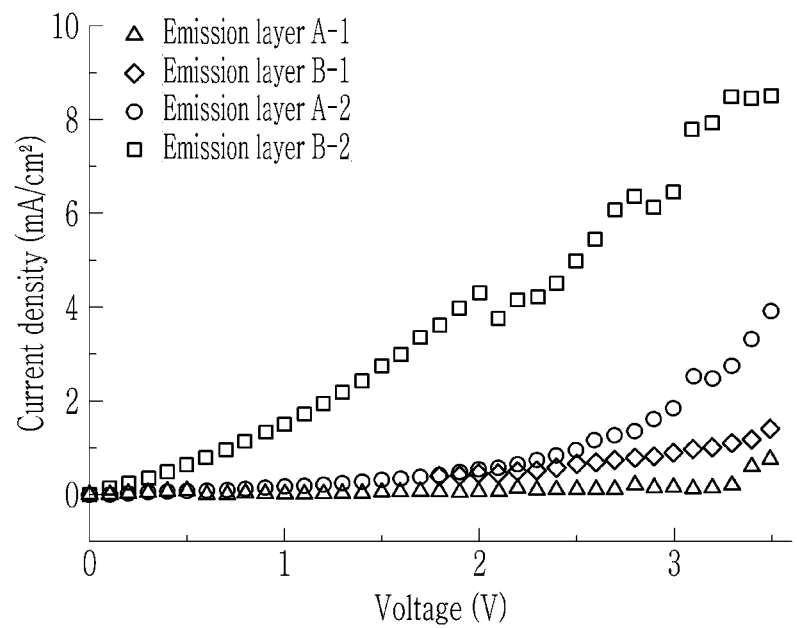
FIG. 5 is a graph of a current density versus an applied voltage for each of the metal-insulator-metal (MIM) devices prepared in Experimental Example 2.

For each of the MIM devices, current-voltage (I-V) characteristics are measured and the results are summarized in FIG. 5. The results of FIG. 5 confirm the followings.

The device including the emission layer B-1 of the halogen exchanged ligand quantum dots may show a current density that is increased in comparison with the device including the emission layer A-1.

The device including the emission layer A-2 or the emission layer B-2 that includes the I-type semiconductor material may show a current density that is increased in comparison with the device including the emission layer A-1 or the device including the emission layer B-1.

The results may indicate the order of the charge (hole and electron) or bipolar transport ability (e.g., the emission layer A-1<the emission layer B-1<emission layer A-2<emission layer B-2).

Example 1

[1] Preparation of Device

A device having a stacked structure of ITO (155 nm)/PEDOT:PSS (30 nm)/TFB (25 nm)/1$^{st}$ emission layer (20 nm)/2$^{nd}$ emission layer (16 nm)/3$^{rd}$ emission layer (12 nm)/$Zn_{0.85}Mg_{0.15}O$ (20 nm)/Al (100 nm) is manufactured as follows.

An ITO-deposited glass substrate is surface-treated with UV-ozone for 15 minutes and then spin-coated with a PEDOT:PSS solution (H. C. Starks) and heated at 150° C. for 10 minutes under an air atmosphere, and then is heat-treated again at 150° C. for 10 minutes under an $N_2$ atmosphere to provide a hole injection layer having a thickness of 30 nm. Subsequently, a poly[(9,9-dioctylfluorenyl-2,7-diyl)-co(N-(4-butylphenyl)diphenylamine] solution (TFB) (Sumitomo) is spin-coated on the hole injection layer and heat-treated at 150° C. for 30 minute to form a hole transport layer.

On the obtained hole transport layer, a solution of the core-shell quantum dots prepared by Synthesis Example 1-1 dispersed in octane is spin-coated and heat-treated at 80° C. for 30 minutes to form a blue light emission layer. Zinc chloride is dissolved in ethanol to prepare a treating solution (concentration: 0.1 g/mL). The treating solution is added dropwise on the formed blue light emission layer and kept it as it is for one minute. A portion of the treating solution is removed by spin-coater and then the layer is washed with ethanol five times, and then is dried on an 80° C. hot plate for 20 minutes to obtain a first emission layer.

A coating solution prepared by mixing a core/shell quantum dot dispersion of Synthesis Example 1-1 (90 wt %) with the I-type semiconductor material of Chemical Formula 3C (10 wt %) is spin-coated on the first emission layer, and then is dried on a hot plate at a temperature of 80° C. for 20 minutes to form a second emission layer:

Chemical Formula 3C

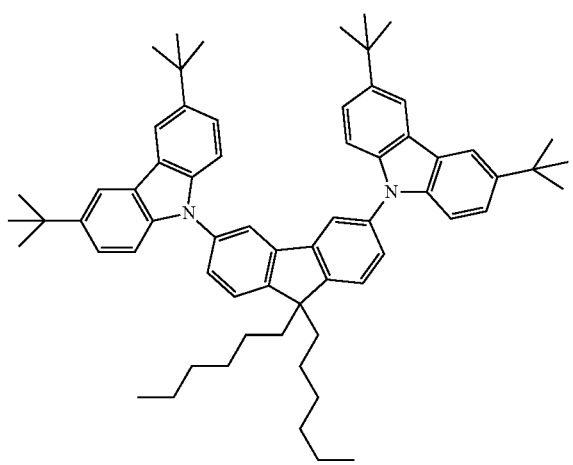

To a core/shell quantum dot dispersion of Synthesis Example 1-1 is added $ZnCl_2$ and a resulting mixture is stirred at 60° C. for 30 minutes to exchange a portion of the organic ligand with the Cl and the ligand exchanged quantum dots thus prepared are dispersed again in octane to obtain a coating solution. The obtained coating solution is spin-coated onto the second emission layer and is dried on a hot plate at a temperature of 80° C. for 20 minutes to form a third emission layer.

A solution of the ZnMgO nanoparticles prepared in Synthesis Example 2 (solvent: ethanol, optical density: 0.5 a.u) is prepared. The solution is spin-coated on the third emission layer and heat-treated at 80° C. for 30 minutes to form an electron auxiliary layer. On a portion of the surface of the electron auxiliary layer, aluminum (Al) is vacuum-deposited to form a second electrode to manufacture a light emitting device shown in FIG. 2.

[2] Comparison of Hole Transport Abilities for Each of the Emission Layers in HOD Three Hole Only Devices (HOD, ITO/PEDOT:PSS/TFB/QD emission layer/4,4',4"-tris(N-carbazolyl)-triphenylamine (TCTA)/HAT-CN/Ag) are prepared each having the first emission layer, the second emission layer, or the third emission layer as the QD emission layer, respectively, and the hole transport abilities thereof are measured.

In the HOD device, each of the first emission layer, the second emission layer, and the third emission layer is formed on the TFB in the same manner as set forth above.

The results confirm that at 12 volts, the hole density of the first emission layer is about three times greater than the hole density of the second emission layer and about 18 times greater than the hole density of the third emission layer.

[3] Comparison of Electron Transport Abilities for Each of the Emission Layers in EOD Three Electron Only Devices (EOD, ITO/ZnMgO/QD emission layer/ZnMgO/Al) are prepared each having the first emission layer, the second emission layer, or the third emission layer as the QD emission layer, respectively, and the electron transport abilities thereof are measured.

In the EOD device, each of the first emission layer, the second emission layer, and the third emission layer is formed on ZnMgO in the same manner as set forth above.

The results confirm that at 12 volts, the electron density of the second emission layer is about 1.875 times greater than that of the first emission layer and about 3 times greater than that of the third emission layer.

[4] SEM-EDX Analysis

A SEM-EDX analysis is made for the first emission layer and the results confirm that a mole ratio of Cl with respect to zinc is about 0.1.

[5] IR Analysis

An infrared spectroscopy analysis is conducted for the first emission layer and the third emission layer to confirm peak intensities for a characteristic peak of the C—H vibration at 2852 $cm^{-1}$ and a characteristic peak of the a COO— vibration at 1556 $cm^{-1}$. The results show that the ratios of the peak intensities of the C—H vibration (2852 $cm^{-1}$) and the COO— vibration (1556 $cm^{-1}$) for the first emission layer of about 11% and about 26.4%, with respect to those of the third emission layer (100%), respectively. This result indicates that the organic ligand (i.e., oleic acid) amount of the first emission layer is less than that of the third emission layer.

Example 2

A device having a stacked structure of ITO (155 nm)/PEDOT:PSS (30 nm)/TFB (25 nm)/1$^{st}$ emission layer (20 nm)/3$^{rd}$ emission layer (16 nm)/2$^{nd}$ emission layer (16 nm)/ Zn$_{0.85}$Mg$_{0.15}$O (20 nm)/Al (100 nm) is manufactured in the same manner as Example 1 except for the followings.

To a core/shell quantum dot dispersion of Synthesis Example 1-1 is added ZnCl$_2$ and a resulting mixture is stirred at 60° C. for 30 minutes to exchange a portion of the organic ligand with the Cl and the ligand exchanged quantum dots thus prepared are dispersed again in octane to obtain a coating solution. The obtained coating solution is spin-coated onto the first emission layer and is dried on a hot plate at a temperature of 80° C. for 20 minutes to form a third emission layer.

A coating solution prepared by mixing a core/shell quantum dot dispersion of Synthesis Example 1-1 (90 wt %) with the I-type semiconductor material of Chemical Formula 3C (10 wt %) is spin-coated on the third emission layer, and then is dried on a hot plate at a temperature of 80° C. for 20 minutes to form a second emission layer.

Chemical Formula 3C

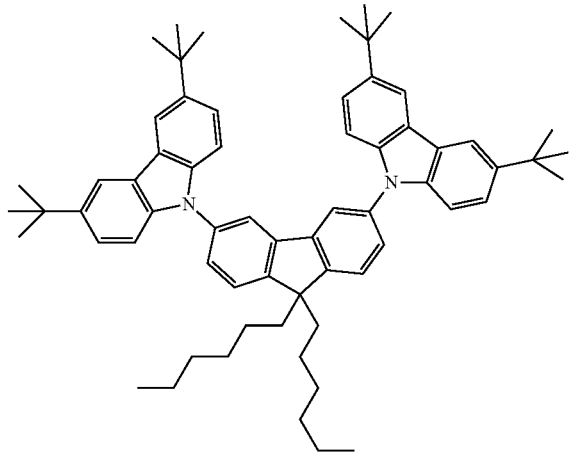

Example 3

[1] Preparation of Device

A device having a stacked structure of ITO (155 nm)/ PEDOT:PSS (30 nm)/TFB (25 nm)/1$^{st}$ emission layer (20 nm)/2$^{nd}$ emission layer (12 nm)/3$^{rd}$ emission layer (12 nm)/ Zn$_{0.85}$Mg$_{0.15}$O (20 nm)/Al (100 nm) is manufactured in the same manner as Example 1 except for the followings.

A thickness of the second emission layer is 12 nm.

On the second emission layer, a solution of the core-shell quantum dots prepared by Synthesis Example 1-1 dispersed in octane is spin-coated and heat-treated at 80° C. for 20 minutes to form a third emission layer.

[2] Comparison of Hole Transport Abilities for Each of the Emission Layers in HOD Three Hole Only Devices (ITO/PEDOT:PSS/TFB/QD emission layer/organic HTL/HAT-CN/Ag) are prepared each having the first emission layer, the second emission layer, or the third emission layer as the QD emission layer, respectively, and the hole transport abilities thereof are measured.

In the HOD device, each of the first emission layer, the second emission layer, and the third emission layer is formed on the TFB in the same manner as set forth above.

The results confirm that at 12 volts, the hole density of the first emission layer is about three times greater than the hole density of the second emission layer and at least about 20 times greater than the hole density of the third emission layer.

Example 4

A device having a stacked structure of ITO (155 nm)/ PEDOT:PSS (30 nm)/TFB (25 nm)/1$^{st}$ emission layer (28 nm)/2$^{nd}$ emission layer (12 nm)/3$^{rd}$ emission layer (12 nm)/ Zn$_{0.85}$Mg$_{0.15}$O (20 nm)/Al (100 nm) is manufactured in the same manner as Example 1 except for the followings.

A thickness of the first emission layer and a thickness of the second emission layer are 28 nm and 12 nm, respectively.

Example 5

A device having a stacked structure of ITO (155 nm)/ PEDOT:PSS (30 nm)/TFB (25 nm)/1$^{st}$ emission layer (28 nm)/2$^{nd}$ emission layer (12 nm)/3$^{rd}$ emission layer (12 nm)/ Zn$_{0.85}$Mg$_{0.15}$O (20 nm)/Al (100 nm) is manufactured in the same manner as Example 1 except for the followings.

A thickness of the first emission layer and a thickness of the second emission layer are 28 nm and 12 nm, respectively.

On the second emission layer, a solution of the core-shell quantum dots prepared by Synthesis Example 1-1 dispersed in octane is spin-coated and heat-treated at 80° C. for 20 minutes to form a third emission layer.

Example 6

A device having a stacked structure of ITO (155 nm)/ PEDOT:PSS (30 nm)/TFB (25 nm)/1$^{st}$ emission layer (24 nm)/2$^{nd}$ emission layer (12 nm)/3$^{rd}$ emission layer (12 nm)/ Zn$_{0.85}$Mg$_{0.15}$O (20 nm)/Al (100 nm) is manufactured in the same manner as Example 1 except for the followings.

A thickness of the first emission layer and a thickness of the second emission layer are 24 nm and 12 nm, respectively.

On the second emission layer, a solution of the core-shell quantum dots prepared by Synthesis Example 1-1 dispersed in octane is spin-coated and heat-treated at 80° C. for 20 minutes to form a third emission layer.

Comparative Example 1

A device having a stacked structure of ITO (155 nm)/ PEDOT:PSS (30 nm)/TFB (25 nm)/single emission layer (32 nm)/Zn$_{0.85}$Mg$_{0.15}$O (20 nm)/Al (100 nm) is manufactured in the same manner as Example 1 except for not forming the first emission layer, the second emission layer, and the third emission layer but forming a single emissive layer as below:

On the hole transport (TFB) layer, a solution of the core-shell quantum dots prepared by Synthesis Example 1-1 dispersed in octane is spin-coated and heat-treated at 80° C. for 30 minutes to form a single emissive layer.

Comparative Example 2

A device having a stacked structure of ITO (155 nm)/ PEDOT:PSS (30 nm)/TFB (25 nm)/single emission layer (32 nm)/Zn$_{0.85}$Mg$_{0.15}$O (20 nm)/Al (100 nm) is manufactured in the same manner as Example 1 except for not forming the first emission layer, the second emission layer, and the third emission layer but forming a single emissive layer as below:

To a core/shell quantum dot dispersion of Synthesis Example 1-1 is added $ZnCl_2$ and a resulting mixture is stirred at 60° C. for 30 minutes to exchange a portion of the organic ligand with the Cl and the ligand exchanged quantum dots thus prepared are dispersed again in octane to obtain a coating solution. The obtained coating solution is spin-coated onto the hole transporting (TFB) layer and is dried on a hot plate at a temperature of 80° C. for 20 minutes to form a single emissive layer.

Comparative Example 3

A device having a stacked structure of ITO (155 nm)/PEDOT:PSS (30 nm)/TFB (25 nm)/single emission layer (32 nm)/$Zn_{0.85}Mg_{0.15}O$ (20 nm)/Al (100 nm) is manufactured in the same manner as Example 1 except for not forming the first emission layer, the second emission layer, and the third emission layer but forming a single emissive layer as below:

A coating solution prepared by mixing a core/shell quantum dot dispersion of Synthesis Example 1-1 (90 wt %) with the I-type semiconductor material of Chemical Formula 3C (10 wt %) is spin-coated on the hole transporting (TFB) layer, and then is dried on a hot plate at a temperature of 80° C. for 20 minutes to form a second emission layer.

Comparative Example 4

A device having a stacked structure of ITO (155 nm)/PEDOT:PSS (30 nm)/TFB (25 nm)/$1^{st}$ emission layer (20 nm)/$3^{rd}$ emission layer (20 nm)/$Zn_{0.85}Mg_{0.15}O$ (20 nm)/Al (100 nm) is manufactured in the same manner as Example 1 except for not forming the second emission layer and forming the first emission layer and the third emission layer as below:

On the hole transport layer, a solution of the core-shell quantum dots prepared by Synthesis Example 1-1 dispersed in octane is spin-coated and heat-treated at 80° C. for 30 minutes to form a blue light emission layer. Zinc chloride is dissolved in ethanol to prepare a treating solution (concentration: 0.1 g/mL). The treating solution is added dropwise on the formed blue light emission layer and kept it as it is for one minute. A portion of the treating solution is removed by spin-coater and then the layer is washed with ethanol five times, and then is dried on an 80° C. hot plate for 20 minutes to obtain a first emission layer.

To a core/shell quantum dot dispersion of Synthesis Example 1-1 is added $ZnCl_2$ and a resulting mixture is stirred at 60° C. for 30 minutes to exchange a portion of the organic ligand with the Cl and the ligand exchanged quantum dots thus prepared are dispersed again in octane to obtain a coating solution. The obtained coating solution is spin-coated onto the first emission layer emission layer and is dried on a hot plate at a temperature of 80° C. for 20 minutes to form a third emission layer.

Comparative Example 5

A device having a stacked structure of ITO (155 nm)/PEDOT:PSS (30 nm)/TFB (25 nm)/$1^{st}$ emission layer (28 nm)/$3^{rd}$ emission layer (12 nm)/$Zn_{0.85}Mg_{0.15}O$ (20 nm)/Al (100 nm) is manufactured in the same manner as Comparative Example 4 except for the followings.

A thickness of the first emission layer and a thickness of the third emission layer are 28 nm and 12 nm, respectively.

Comparative Example 6

A device having a stacked structure of ITO (155 nm)/PEDOT:PSS (30 nm)/TFB (25 nm)/$1^{st}$ emission layer (28 nm)/$3^{rd}$ emission layer (24 nm)/$Zn_{0.85}Mg_{0.15}O$ (20 nm)/Al (100 nm) is manufactured in the same manner as Comparative Example 4 except for the followings.

A thickness of the first emission layer and a thickness of the third emission layer are 28 nm and 24 nm, respectively.

Experimental Example 3

Electroluminescent properties of the obtained quantum dot light emitting devices of Example 1 to 6 and Comparative Examples 1-6 are measured using a Keithley 2200 source device and a Minolta CS2000 spectroradiometer (current-voltage-luminance measurement equipment). A current depending upon a voltage applied to the device, luminance, and electroluminescence (EL) are measured by the current-voltage-luminance measurement equipment and thereby external quantum efficiency is calculated. The results are shown in Table 2.

Figure 6:
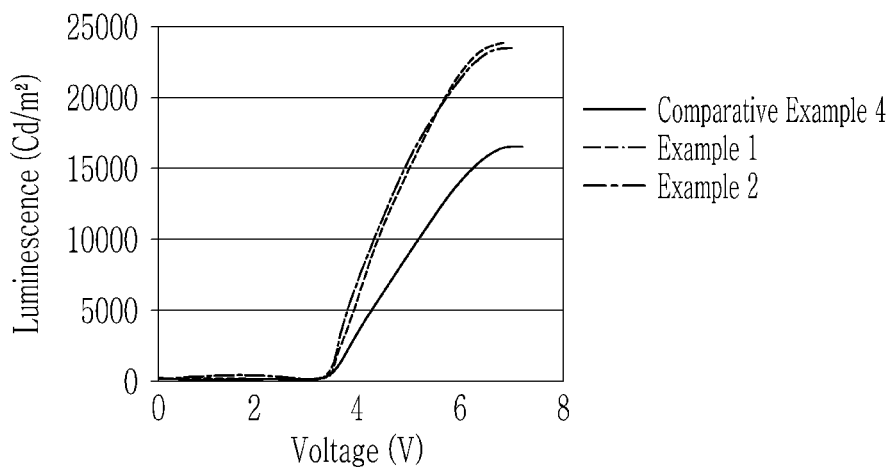
FIG. 6 is a graph of luminance (candelas per square meter ($Cd/m^2$) versus an applied voltage (volt) showing electroluminescence properties of the light emitting devices of Examples 1 and 2 and Comparative Example 4.
Figure 7:
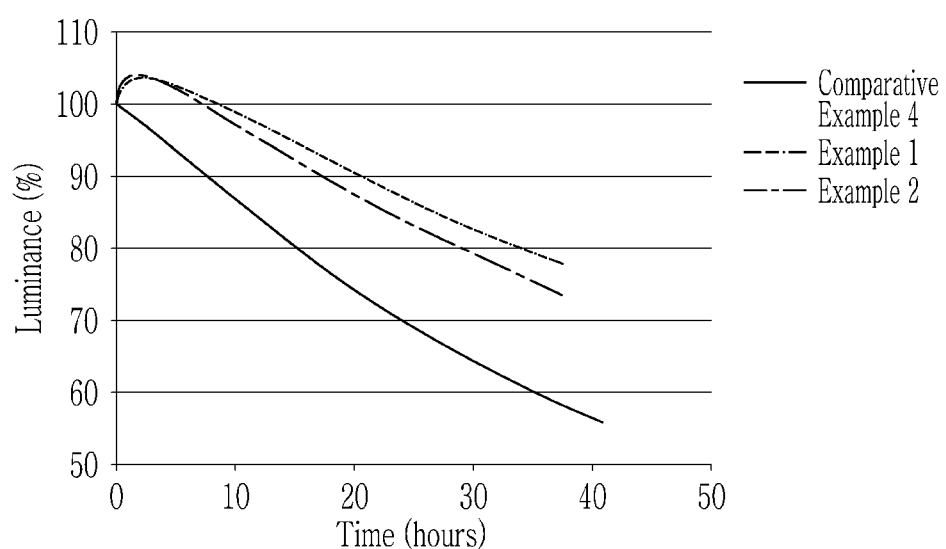
FIG. 7 is a graph of relative luminance (%) versus driving times (hour) showing electroluminescence properties over time of the light emitting devices of Examples 1 and 2 and Comparative Example 4.

For the devices of Examples 1 and 2 and Comparative Examples 4, a luminescence vs. voltage property and a luminescence vs. lifetime (hours) property are graphed in FIG. 6 and FIG. 7, respectively. FIG. 6 shows graphs showing the electroluminescent properties (luminescence vs. voltage) for the devices of Examples 1 and 2 and Comparative Examples 4 and FIG. 7 shows graphs showing the electroluminescent properties (luminescence vs. lifetime) for the devices of Examples 1 and 2 and Comparative Examples 4.

TABLE 2

| | Max. EQE(%) | Lambda max. (nm) | FWHM (nm) | Max Lum. | T95(hr) @325 nit | T50(hr) @325 nit |
|---|---|---|---|---|---|---|
| Example 1 | 27.2 | 455 | 22 | 23740 | 14.2 | 84 |
| Example 2 | 26.7 | 455 | 22 | 23470 | 11.9 | 69 |
| Example 3 | 18.6 | 454 | 22 | 24070 | 9.6 | 85 |
| Example 4 | 14.8 | 454 | 22 | 23420 | 6.5 | 66 |
| Example 5 | 16.3 | 454 | 22 | 33320 | 7.8 | 77 |
| Comp. Example 1 | 12.8 | 455 | 26 | 20050 | 1.2 | 13 |
| Comp. Example 2 | 11.5 | 456 | 28 | 21090 | 3.6 | 24 |
| Comp. Example 3 | 10.9 | 456 | 27 | 18010 | 1.1 | 16 |
| Comp. Example 4 | 9.7 | 456 | 25 | 16540 | 5.4 | 47 |
| Comp. Example 5 | 9.5 | 454 | 25 | 17520 | 1.9 | 38 |
| Comp. Example 6 | 5.2 | 455 | 25 | 13800 | 2.7 | 49 |

Max. EQE: maximum external quantum efficiency
$\lambda_{max}$: maximum luminescence wavelength
Max Lum: maximum luminance (cd/m$^2$)
T95: a time that it takes for a given device to show a 95% of the initial luminance (100%) when the device is operated at 325 nit.
T50: a time that it takes for a given device to show a 50% of the initial luminance (100%) when the device is operated at 325 nit.

Referring to the results of Table 2 and FIGS. 6 and 7, the devices of Examples 1-5 may show improved efficiency, improved luminance, improved FWHM, and/or improved lifetime properties in comparison with the devices of Comparative Examples 1 to 6. The lifetime (T95) of the device of Example 6 is slightly increased in comparison with that of Example 3.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emitting device, comprising
a first electrode and a second electrode facing each other;
an emissive layer disposed between the first electrode and the second electrode;
wherein the emissive layer comprises a layer comprising:
an organic compound having a bipolar transport property, and
a plurality of quantum dots that are configured to emit light of a predetermined color, wherein the emissive layer further comprises a halogen, a p-type semiconductor material, and n-type semiconductor material, or a combination thereof, and
wherein a thickness of the emissive layer is greater than or equal to about 30 nm and less than or equal to about 200 nm.

2. The light emitting device of claim 1, wherein in the emissive layer, the emissive layer comprises the halogen and an amount of a halogen in a portion facing and closer to the first electrode is greater than an amount of the halogen in a portion facing and closer to the second electrode, or
wherein in the emissive layer, an amount of an organic substance in a portion facing and closer to the first electrode is less than an amount of an organic substance in a portion facing and closer to the second electrode.

3. The light emitting device of claim 1, wherein the emissive layer is configured to emit the light of the predetermined color, and
wherein the light of the predetermined color is blue light having a maximum peak wavelength of from about 450 nm to about 490 nm, green light having a maximum peak wavelength of from about 500 nm to about 550 nm, or red light having a maximum peak wavelength of from about 600 nm to about 650 nm.

4. The light emitting device of claim 1, wherein the plurality of the quantum dots comprise an organic ligand, and the organic ligand comprises RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein R is independently a C3 to C40 substituted or unsubstituted aliphatic hydrocarbon group, a C6 to C40 substituted or unsubstituted aromatic hydrocarbon group, or a combination thereof.

5. The light emitting device of claim 1, wherein the first electrode is an anode and the second electrode is a cathode, and
wherein in the emissive layer, a hole transport ability of a portion facing and closer to the first electrode is greater than a hole transport ability of a portion facing and closer to the second electrode.

6. The light emitting device of claim 1, wherein the halogen is chlorine.

7. The light emitting device of claim 1, wherein the first electrode is an anode and the second electrode is a cathode, and
wherein an electron transport ability of a portion facing and closer to the second electrode is greater than a portion facing and closer to the first electrode.

8. The light emitting device of claim 1, wherein the emissive layer comprises:
a first emission layer disposed on the first electrode and having a hole transporting property; a second emission layer and a third emission layer disposed on the first emission layer; the second emission layer comprises an organic compound having a bipolar transport property, and the third emission layer has a composition different from the first emission layer and the second emission layer,
and optionally wherein the second emission layer is disposed on the first emission layer and the third emission layer is disposed on the second emission layer, or wherein the third emission layer is disposed on the first emission layer and the second emission layer is disposed on the third emission layer.

9. The light emitting device of claim 8, wherein an amount of an organic ligand in the first emission layer is less than an amount of an organic ligand in the second emission layer or the third emission layer, optionally wherein an amount of an organic ligand in the first emission layer is less than or equal to about 10 wt % with respect to a total weight of the first emission layer.

10. The light emitting device of claim 1, wherein the organic compound having the bipolar transport ability comprises a carbazole group.

11. The light emitting device of claim 1, wherein the organic compound having the bipolar transport property comprises a carbazole unit comprising at least one functional group selected from a substituted or unsubstituted C4 to C15 alkyl group, a cyano group, a heteroaryl group containing a O-moiety, a S-moiety, a Se-moiety, a Te-moiety, a N-moiety, and a combination thereof, optionally wherein the functional group comprises a substituted or unsubstituted carbazolyl group, a substituted or unsubstituted arylamine group, a substituted or unsubstituted aryl phosphine group, a substituted or unsubstituted aryl phosphine oxide group, a substituted or unsubstituted phenothiazinyl group, a substituted or unsubstituted phenoxazinyl group, a substituted or unsubstituted dihydrophenazinyl group, a substituted or unsubstituted pyrazolyl group, a substituted or unsubstituted pyridyl group, a substituted or unsubstituted azulenyl group, a substituted or unsubstituted thiophenyl group, a substituted or unsubstituted pyrrolyl group, a substituted or unsubstituted furanyl group, or a combination thereof.

12. The light emitting device of claim 1, wherein the organic group having the bipolar transport property comprises a compound represented by Chemical Formula 1:

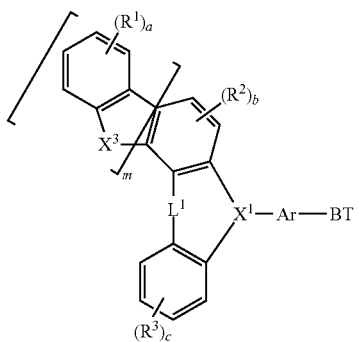

Chemical Formula 1

In Chemical Formula 1,

Ar is a C6 or higher aromatic group;

BT is a bipolar transport group comprising a substituted or unsubstituted hetero aromatic group containing a O-, S-, Se-, Te-, or N-moiety, $R^1$ to $R^3$ are selected each independently from hydrogen, a substituted or unsubstituted C4 to C15 alkyl group, a substituted or unsubstituted C3 to C20 cycloalkyl group, a substituted or unsubstituted C6 to C20 aryl group, a substituted or unsubstituted C3 to C20 heteroaryl group, a substituted or unsubstituted alkylamine group, a substituted or unsubstituted arylamine group, a substituted or unsubstituted carbazolyl group, and a combination thereof, provided that at least one of $R^1$ to $R^3$ is a substituted or unsubstituted C4 to C15 alkyl group, and a is an integer of 1 to 4, c is an integer of 1 to 4, and b is 1 or 2, $X^1$ is N or $C(R^a)$, wherein $R^a$ is independently selected from hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, and a combination thereof, $L^1$ is a single bond, a substituted or unsubstituted methylene group, or a substituted or unsubstituted C2 to C4 alkenylene group, and m is 0 or 1, and when m is 1, $X^3$ is S, N—$R^b$, or $C(-R^c)(-R^d)$, wherein $R^b$, $R^c$ and $R^d$ are each independently hydrogen, a cyano group, a substituted or unsubstituted C1 to C20 alkyl group, a substituted or unsubstituted C3 to C20 cycloalkyl group, a substituted or unsubstituted C6 to C20 aryl group, a substituted or unsubstituted C3 to C20 heteroaryl group, or a combination thereof, optionally wherein:

when a is an integer of 2 to 4, $R^1$ moieties are present independently from one another or any two $R^1$ adjacent to each other are optionally linked to one another to form a C5 to C15 fused ring, when c is an integer of 2 to 4, $R^3$ moieties are present independently from one another or any two $R^3$ adjacent to each other are optionally linked to one another to form a C5 to C15 fused ring, and when the b is 2, $R^2$ moieties are present independently from one another or any two $R^2$ adjacent to each other are optionally linked to one another to form a C5 to C15 fused ring, and wherein the bipolar transport group comprises a substituted or unsubstituted carbazolyl group.

13. The light emitting device of claim 1, wherein the organic compound comprises a moiety represented by any of Chemical Formulae 2A to 2E:

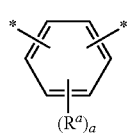

Chemical Formula 2A in Chemical Formula 2A, $R^a$ is each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, and a substituted or unsubstituted C3 to C30 heteroaryl group, and a is an integer of 1 to 4;

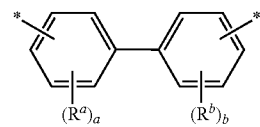

Chemical Formula 2B in Chemical Formula 2B, $R^a$ and $R^b$ are each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, and a combination thereof, and a and b are each independently an integer of 1 to 4;

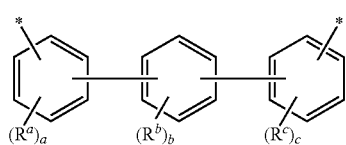

Chemical Formula 2C in Chemical Formula 2C, $R^a$, $R^b$ and $R^c$ are each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, and a combination thereof, and a, b and c are each independently an integer of 1 to 4;

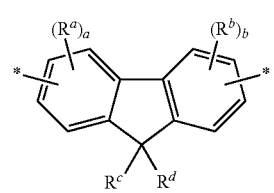

Chemical Formula 2D in Chemical Formula 2D, $R^a$, $R^b$, $R^c$, and $R^d$ are each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, and a combination thereof, and a and b are each independently an integer of 1 to 3;

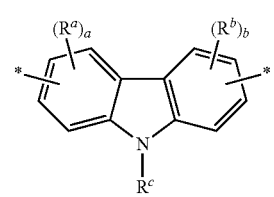

Chemical Formula 2E in Chemical Formula 2E, $R^a$, $R^b$ and $R^c$ are each independently selected from hydrogen, a cyano group, a substituted or unsubstituted C1 to C20 alkyl group, a substituted or unsubstituted C3 to C20 cycloalkyl group, a substituted or unsubstituted C6 to C30 aryl group, a substituted or unsubstituted C3 to C30 heteroaryl group, and a combination thereof, and a and b are each independently an integer of 1 to 3.

14. The light emitting device of claim 1, wherein the plurality of the quantum dots does not comprise cadmium, lead, or a combination thereof, and
wherein the plurality of quantum dots comprises zinc, selenium, sulfur, and optionally tellurium.

15. The light emitting device of claim 1, wherein the charge auxiliary layer comprises a plurality of nanoparticles and a nanoparticle of the plurality of nanoparticles comprises a metal oxide represented by $Zn_{1-x}M_xO$, wherein M is Mg, Ca, Zr, W, Li, Ti, Y, Al, or a combination thereof, and $0 \leq x \leq 0.5$.

16. The light emitting device of claim 1, wherein the thickness of the emissive layer is greater than or equal to about 45 nm and less than or equal to about 180 nm.

17. The light emitting device of claim 1, wherein the light emitting device has T95 of greater than or equal to about 6.5 hours, or wherein the light emitting device has a maximum external quantum efficiency (EQE) of greater than or equal to about 14%.

18. A display device comprising the light emitting device of claim 1.

19. The light emitting device of claim 1, wherein the emissive layer comprises the p-type semiconductor material and the p-type semiconductor material comprises a p-type organic polymer semiconductor, a p-type organic monomolecular semiconductor, a p-type inorganic semiconductor, or a combination thereof.

20. The light emitting device of claim 19, wherein the p-type organic polymer semiconductor comprises a poly (styrene sulfonate), a poly-N-vinylcarbazole, a polyphenylene vinylene, a polyparaphenylene vinylene, a poly (meth)acrylate, a polyarylamine, a polyaniline, a polypyrrole, a poly(9,9-alkylfluorene), a poly(spiro-fluorene), a poly(3-alkylthiopene)(P3AT), a derivative of any of the foregoing, or a combination thereof, and
wherein the p-type organic monomolecular semiconductor comprises a pyrazoline, an arylamine, a stilbene, a triphenyldiamine, a derivative of any of the foregoing, or a combination thereof, and
wherein the p-type inorganic semiconductor comprises an NiO, a $WO_x$ (x is determined according to the oxidation number of the tungsten), a $MoO_3$, a CuI, a CuBr, or a combination thereof.

21. The light emitting device of claim 1, wherein the emissive layer comprises the n-type semiconductor material and the n-type semiconductor material comprises an n-type organic monomolecular semiconductor, a n-type inorganic semiconductor, or a combination thereof.

22. The light emitting device of claim 21, wherein the n-type organic monomolecular semiconductor comprise a carboxylic acid compound, a quinolone, a triazine, a quinoline, a triazole, a naphthalene, an oxadiazole, an anthraquinodimethane, a benzoquinone, a naphthoquinone, an anthraquinone, a tetracyano anthraquinodimethane, a fluorenone, a diphenyldicyanoethylene, a diphenoquinone, a 8-hydroxyquinoline, a metal complex of any of the foregoing, a derivative of any of the foregoing, and the n-type inorganic semiconductor $TiO_2$, $SnO_2$, ZnO, $ZrO_2$, $WO_3$, $Nb_2O_5$, $TiSrO_3$ or $In_2O_3$, or a combination thereof.

23. The light emitting device of claim 1, wherein the emissive layer comprises:
a first emission layer disposed on the first electrode and having a hole transporting property; a second emission layer and a third emission layer disposed on the first emission layer; the second emission layer comprises an organic compound having a bipolar transport property, and the third emission layer has a composition different from the first emission layer and the second emission layer, and
wherein the first emission layer is configured to exhibit a current density of greater than or equal to about 2 $mA/cm^2$ and less than or equal to about 10 $mA/cm^2$,
wherein the second emission layer is configured to exhibit a current density of greater than or equal to about 1.5 $mA/cm^2$ and less than or equal to about 20 $mA/cm^2$, and
wherein the third emission layer is configured to exhibit a current density of less than or equal to about 1.4 $mA/cm^2$, or the second emission layer is configured to exhibit a current density that is greater than a current density of the third emission layer by at least about 0.1 $mA/cm^2$.

24. A light emitting device, comprising
an anode and a cathode facing each other;
an emissive layer disposed between the anode and the cathode; and
an electron auxiliary layer disposed between the emissive layer and the cathode,
wherein the emissive layer comprises:
an organic compound having a bipolar transport property,
a plurality of quantum dots that are configured to emit light of a predetermined color, and optionally chlorine,
wherein a thickness of the emissive layer is greater than or equal to about 35 nm and less than or equal to about 200 nm,
wherein in the emissive layer, an amount of an organic substance in a portion facing and closer to the anode is less than an amount of an organic substance in a portion facing and closer to the cathode, and
wherein the electron auxiliary layer comprises a plurality of nanoparticles comprising a metal oxide represented by $Zn_{i-x}M_xO$, wherein M is Mg, Ca, Zr, W, Li, Ti, Y, Al, or a combination thereof, and $0 \leq x \leq 0.5$.

25. The light emitting device of claim 24,
wherein a thickness of the emissive layer is greater than or equal to about 44 nm and less than or equal to about 150 nm, and
wherein in the emissive layer, an amount of chlorine in a portion facing and closer to the anode is greater than an amount of halogen in a portion facing and closer to the cathode.

* * * * *